(12) United States Patent
Cideciyan et al.

(10) Patent No.: US 8,869,011 B2
(45) Date of Patent: Oct. 21, 2014

(54) UNEQUAL ERROR PROTECTION SCHEME FOR HEADERIZED SUB DATA SETS

(71) Applicant: International Business Machines Corporation, Armonk, NY (US)

(72) Inventors: Roy D. Cideciyan, Rueschlikon (CH); Robert A. Hutchins, Tucson, AZ (US); Thomas Mittelholzer, Zurich (CH); Keisuke Tanaka, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 13/733,847

(22) Filed: Jan. 3, 2013

(65) Prior Publication Data

US 2014/0189461 A1 Jul. 3, 2014

(51) Int. Cl.
  *H03M 13/00* (2006.01)
  *H04L 1/00* (2006.01)
  *H03M 13/29* (2006.01)
  *G06F 11/10* (2006.01)
  *G11B 7/007* (2006.01)
  *G11B 20/18* (2006.01)
  *H03M 13/03* (2006.01)

(52) U.S. Cl.
  CPC ......... *H04L 1/0061* (2013.01); *H03M 13/2909* (2013.01); *G06F 11/1012* (2013.01); *G11B 7/007* (2013.01); *G11B 20/1809* (2013.01); *H03M 13/03* (2013.01)
  USPC ........... 714/776; 714/752; 714/755; 714/756; 714/771; 714/784

(58) Field of Classification Search
  CPC .......... G06F 11/1012; H03M 13/2909; H03M 13/03; H03M 13/1515; H03M 13/2924; H03M 13/373; G11B 7/007; G11B 20/1809; G11B 20/1866
  USPC .................. 714/776, 752, 755, 756, 771, 784
  See application file for complete search history.

(56) References Cited

U.S. PATENT DOCUMENTS 4,955,022 A * 9/1990 Odaka ........................... 714/755
6,631,485 B1 * 10/2003 Morley et al. .................. 714/701

(Continued)

FOREIGN PATENT DOCUMENTS

CN 102272841 12/2011
WO WO2012072330 6/2012

OTHER PUBLICATIONS

International Search Report and Written Opinion from PCT Application No. PCT/IB2013/061025 dated May 16, 2014.

*Primary Examiner* — John Trimmings
(74) *Attorney, Agent, or Firm* — Zilka-Kotab, PC

(57) ABSTRACT

In one embodiment, a method includes receiving a headerized SDS protected by unequal error protection; decoding a header from the headerized SDS and removing an impact of the header from C1 row parity to obtain a SDS; for a number of iterations: performing C2 column decoding, for no more than a number of interleaves in each row of the SDS: overwriting a number of columns with successfully decoded C2 codewords, erasing a number of C2 codewords, and maintaining remaining columns as uncorrected, performing C1 row decoding; for no more than a number of interleaves in each row of the SDS: overwriting a number of rows with successfully decoded C1 codewords, erasing a number of C1 codewords, and maintaining remaining rows as uncorrected; and outputting the SDS when all rows include only C1 codewords and all columns include only C2 codewords; otherwise, outputting indication that the SDS cannot be decoded properly.

25 Claims, 12 Drawing Sheets

(56) References Cited

U.S. PATENT DOCUMENTS 6,898,754 B2 * 5/2005 Paterson ................. 714/784

2010/0232047 A1 * 9/2010 Cherubini et al. .............. 360/48
2011/0252290 A1 10/2011 Cideciyan et al.
2012/0144271 A1 6/2012 Cideciyan et al.

* cited by examiner

UNEQUAL ERROR PROTECTION SCHEME FOR HEADERIZED SUB DATA SETS

BACKGROUND

The present invention relates to data storage, and more particularly, to improving the error rate performance of headerized sub data sets protected by unequal error protection.

Data sets written on tape include subunits referred to as sub data sets. In 16-channel linear tape open generation 6 (LTO 6), there are thirty-two sub data sets within each three megabyte (MB) data set, whereas in a 32-channel enterprise drive there are sixty-four sub data sets within each six MB data set. All rows of a sub data set, which are also known as codeword interleaves (CWIs) which include four byte-interleaved C1 codewords (row codewords) in LTO 6, are written along different tape tracks as far apart from each other as possible. This minimizes the number of erased bytes in a C2 codeword (column codeword) that occur as a result of a spatial burst error on the tape. In other words, rows of a sub data set are distributed within a written data set in an approximately equidistant manner providing deep spatial interleaving among rows of a sub data set. Furthermore, if all bytes written in a circle having a diameter of about 1 mm cannot be read, at most one erased byte would be caused within a C2 codeword.

A 12-byte header is usually appended to each row of a sub data set giving rise to a headerized sub data set structure. In enterprise drives, headerized sub data sets provide header error protection by embedding header fragments into row codewords of a sub data set making sub data sets robust to header errors. In this case, data is protected by two-level error correction code (ECC) as in the case of product codes, whereas headers are protected by one-level ECC (typically just C1 coding).

Headerized sub data sets with unequal error protection are decoded only by C1 decoding followed by C2 decoding, i.e., no iteration is performed on the headerized sub data sets. This decoding can lead to higher error rates than are necessary, and sometimes acceptable, due to the single C1 decoding followed by C2 decoding. Accordingly, it would be beneficial to have a decoding scheme which improves the error rate performance (reduces the error rate) of decoded headerized sub data sets with unequal error protection.

BRIEF SUMMARY

In one embodiment, a system for decoding a headerized sub data set (SDS) includes logic adapted to receive a headerized SDS protected by unequal error protection, wherein a header of the headerized SDS is protected by one level of error correction code (ECC) and data of the headerized SDS is protected by two levels of ECC; logic adapted to decode a header from the headerized SDS and removing an impact of the header from C1 row parity to obtain a SDS; logic adapted to, for no more than a predetermined number of iterations: perform C2 column decoding on the SDS, and for no more than a number of interleaves in each row of the SDS: overwrite a number of columns of the SDS with successfully decoded C2 codewords, erase a number of C2 codewords of the SDS, and maintain remaining columns of the SDS as uncorrected; perform C1 row decoding on the SDS; for no more than a number of interleaves in each row of the SDS: overwrite a number of rows of the SDS with successfully decoded C1 codewords, erase a number of C1 codewords of the SDS, and maintain remaining rows of the SDS as uncorrected; and logic adapted to output the SDS when all rows of the SDS include only C1 codewords and all columns of the SDS include only C2 codewords; otherwise, output an indication that the SDS cannot be decoded properly.

In another embodiment, a system for decoding a headerized SDS includes logic adapted to receive a headerized SDS protected by unequal error protection, wherein a header of the headerized SDS is protected by one level of ECC and data of the headerized SDS is protected by two levels of ECC; logic adapted to perform C1' row decoding to decode a header from the headerized SDS by modifying C1' row parity of the headerized SDS by removing an impact of the header from the C1' row parity to obtain C1 row parity; logic adapted to extract the header from the headerized SDS to obtain a SDS1 (0) and performing an error check on the header; logic adapted to erase the C1' row parity to indicate that C1 row parity is unknown when the header fails the error check; for no more than a predetermined number of iterations, i≤i_max, where i is an iteration counter and i_max is a maximum number of iterations: logic adapted to perform C2 column decoding on the SDS1(i-1); logic adapted to determine a number of uncorrectable C2 codewords in a current interleave, j, of a row, where the number of uncorrectable C2 codewords is U2(i,j), with 0≤U2(i,j)≤N1, where N1 is a total number of symbols in a C1 codeword; logic adapted to select a first parameter E2(i,j), such that 0≤E2(i,j)≤U2(i,j) and 0≤E2(i,j)≤(N1−K1), where K1 is a number of data symbols in a C1 codeword; for 1≤j≤j_max iterations, where j_max is a maximum number of interleaves: logic adapted to overwrite N1−U2(i,j) columns of SDS1(i-1,j) with successfully decoded C2 codewords, where SDS1(i-1,j) is a first calculated SDS for interleave j, logic adapted to erase E2(i,j) C2 codewords out of a total of U2(i,j) C2 codewords in SDS1(i-1,j), logic adapted to maintain U2(i,j)−E2(i,j) C2 codewords in SDS1(i-1,j) uncorrected, logic adapted to combine each interleave of overwritten and erased SDS1(i-1,j) to form SDS2(i), where SDS2(i) is a first calculated SDS for iteration i, and logic adapted to stop iterative processing when all rows of SDS2(i) include only C1 codewords and all columns of SDS2(i) include only C2 codewords and output a decoded SDS, SDS2(i); logic adapted to perform C1 row decoding on SDS2(i); logic adapted to determine a number of uncorrectable C1 codewords in the current interleave, j, where the number of uncorrectable C1 codewords is U1(i,j), with 0≤U1(i,j)≤N2, where N2 is a total number of symbols in a column; logic adapted to select a second parameter E1(i,j) such that 0≤E1(i,j)≤U1(i,j) and 0≤E1(i,j)≤(N2−K2), where K2 is a number of data symbols in a column; for 1≤j≤j_max iterations, where j_max is a maximum number of interleaves: logic adapted to overwrite N2−U1(i,j) C1 codewords of SDS2 (i,j) with successfully decoded C1 codewords, where SDS2 (i,j) is a second calculated SDS for interleave j, logic adapted to erase E1(i,j) C1 codewords out of a total of U1(i,j) C1 codewords in SDS2(i,j), logic adapted to maintain U1(i,j)−E1(i,j) C1 codewords in SDS2(i,j) uncorrected, logic adapted to combine each interleave of overwritten and erased SDS2 (i,j) to form SDS1(i), where SDS1(i) is a second calculated SDS for iteration i, and logic adapted to stop iteratively processing when all rows of SDS1(i) include only C1 codewords and all columns of SDS1(i) include only C2 codewords and outputting a decoded SDS, SDS1(i); logic adapted to increment the iteration counter, i, by one; and logic adapted to output an indication that the headerized SDS cannot be decoded properly when the maximum number of iterations has been reached and all rows are not C1 codewords and/or all columns are not C2 codewords.

According to another embodiment, a method for decoding a headerized SDS includes receiving a headerized SDS protected by unequal error protection, wherein a header of the headerized SDS is protected by one level of ECC and data of the headerized SDS is protected by two levels of ECC; decoding a header from the headerized SDS and removing an impact of the header from C1 row parity to obtain a SDS; for no more than a predetermined number of iterations: performing C2 column decoding on the SDS, for no more than a number of interleaves in each row of the SDS: overwriting a number of columns of the SDS with successfully decoded C2 codewords, erasing a number of C2 codewords of the SDS, and maintaining remaining columns of the SDS as uncorrected, performing C1 row decoding on the SDS; for no more than a number of interleaves in each row of the SDS: overwriting a number of rows of the SDS with successfully decoded C1 codewords, erasing a number of C1 codewords of the SDS, and maintaining remaining rows of the SDS as uncorrected; and outputting the SDS when all rows of the SDS include only C1 codewords and all columns of the SDS include only C2 codewords; otherwise, outputting an indication that the SDS cannot be decoded properly.

In yet another embodiment, a method for encoding sub data sets includes receiving a headerized SDS protected by unequal error protection, wherein a header of the headerized SDS is protected by one level of ECC and data of the headerized SDS is protected by two levels of ECC; performing C1' row decoding to decode a header from the headerized SDS by modifying C1' row parity of the headerized SDS by removing an impact of the header from the C1' row parity to obtain C1 row parity; extracting the header from the headerized SDS to obtain a SDS1(0) and performing an error check on the header; erasing the C1' row parity to indicate that C1 row parity is unknown when the header fails the error check; for no more than a predetermined number of iterations, i i_max, where i is an iteration counter and i_max is a maximum number of iterations: performing C2 column decoding on the SDS, determining a number of uncorrectable C2 codewords in a current interleave j, wherein the number of uncorrectable C2 codewords is U2(i,j), with 0≤U2(i,j)≤N1, where N1 is a total number of symbols in a C1 codeword, selecting a first parameter E2(i,j), where i is an iteration counter and j is a current interleave in a row, such that 0≤E2(i,j)≤U2(i,j) and 0≤E2(i,j)≤(N1−K1), where K1 is a number of data symbols in a C1 codeword, and for 1≤j≤j_max iterations, where j_max is a maximum number of interleaves: overwriting N1−U2(i,j) columns of SDS1(i,j) with successfully decoded C2 codewords, where SDS1(i,j) is a first calculated SDS for interleave j, erasing E2(i,j) C2 codewords out of a total of U2(i,j) C2 codewords in SDS1(i−1,j), maintaining U2(i,j)−E2(i,j) C2 codewords in SDS1(i,j) uncorrected, combining each interleave of SDS1(i,j) to form SDS2(i), where SDS2(i) is a first calculated SDS for iteration i, and stopping the method when all rows of SDS2(i) include only C1 codewords and all columns of SDS2(i) include only C2 codewords and outputting a decoded SDS, SDS2(i); performing C1 row decoding on SDS2(i); determining a number of uncorrectable C1 codewords in the current interleave j, wherein the number of uncorrectable C1 codewords is U1(i,j), with 0≤U1(i,j)≤N2, where N2 is a total number of symbols in a column; selecting a second parameter E1(i,j) such that 0≤E1(i,j)≤U1(i,j) and 0≤E1(i,j)≤(N2−K2), where K2 is a number of data symbols in a column; and for 1≤j≤j_max iterations, where j_max is a maximum number of interleaves: overwriting N2−U1(i,j) columns of SDS2(i,j) with successfully decoded C1 codewords, where SDS2(i,j) is a second calculated SDS for interleave j, erasing E1(i,j) C1 codewords out of a total of U1(i,j) C1 codewords in SDS2(i,j), maintaining U1(i,j)−E1(i,j) C1 codewords in SDS2(i,j) uncorrected, combining each interleave of overwritten and erased SDS2(i,j) to form SDS1(i), where SDS1(i) is a second calculated SDS for iteration i, and stopping the method when all rows of SDS1(i) include only C1 codewords and all columns of SDS1(i) include only C2 codewords and outputting a decoded SDS, SDS1(i); and incrementing the iteration counter, i, by one; and outputting an indication that the headerized SDS cannot be decoded properly when the maximum number of iterations has been reached and all rows are not C1 codewords and/or all columns are not C2 codewords.

According to yet another embodiment, a computer program product for decoding a headerized SDS includes a computer readable storage medium having program code embodied therewith, the program code readable/executable by a tape drive to: receive, by the tape drive, a headerized SDS protected by unequal error protection, wherein a header of the headerized SDS is protected by one level of ECC and data of the headerized SDS is protected by two levels of ECC; decode, by the tape drive, a header from the headerized SDS and removing an impact of the header from C1 row parity to obtain a SDS; for no more than a predetermined number of iterations: perform, by the tape drive, C2 column decoding on the SDS, and for no more than a number of interleaves in each row of the SDS: overwrite, by the tape drive, a number of columns of the SDS with successfully decoded C2 codewords, erase, by the tape drive, a number of C2 codewords of the SDS, and maintain, by the tape drive, remaining columns of the SDS as uncorrected; perform, by the tape drive, C1 row decoding on the SDS; for no more than a number of interleaves in each row of the SDS: overwrite, by the tape drive, a number of rows of the SDS with successfully decoded C1 codewords, erase, by the tape drive, a number of C1 codewords of the SDS, and maintain, by the tape drive, remaining rows of the SDS as uncorrected; and output, by the tape drive, the SDS when all rows of the SDS include only C1 codewords and all columns of the SDS include only C2 codewords; otherwise, output an indication that the SDS cannot be decoded properly.

Other aspects and embodiments of the present invention will become apparent from the following detailed description, which, when taken in conjunction with the drawings, illustrates by way of example the principles of the invention.

DETAILED DESCRIPTION

Figure 1:
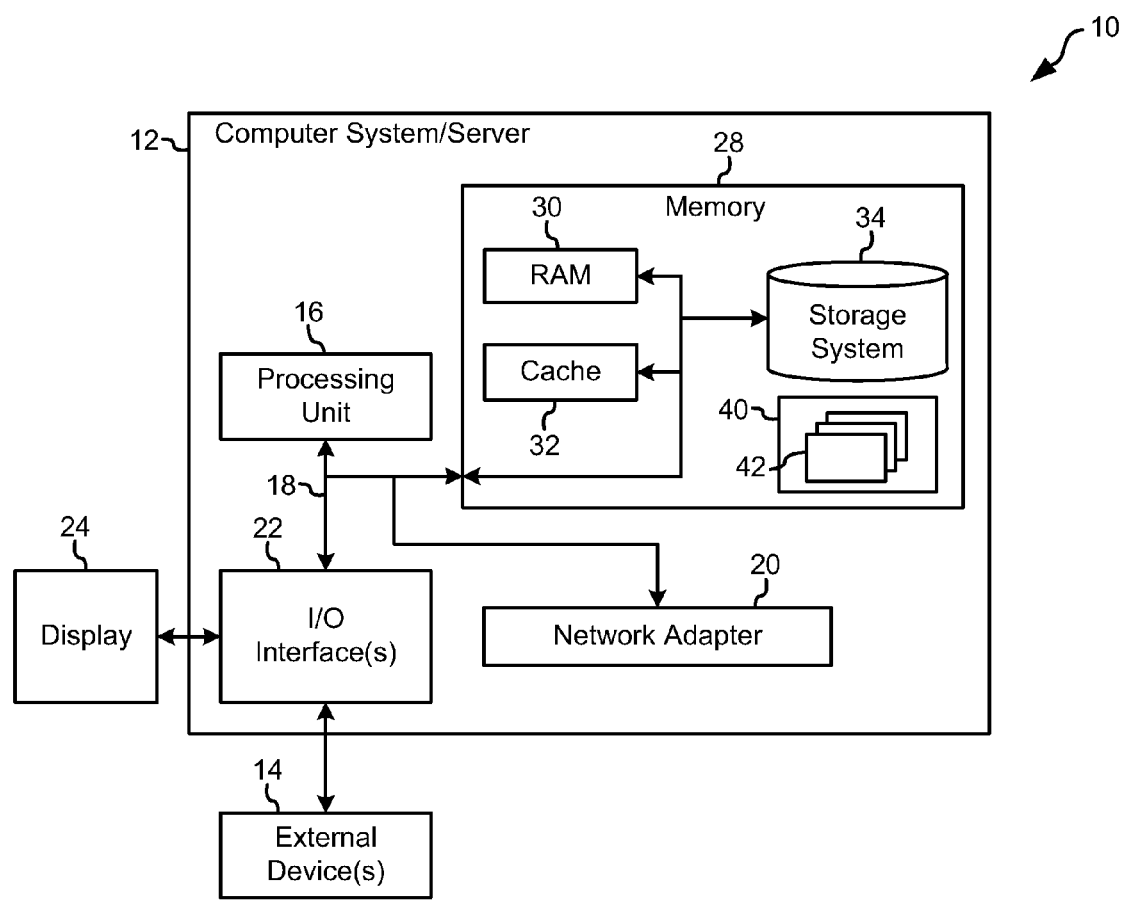
FIG. 1 illustrates a network storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified.

According to one embodiment, hard-decision/erasure based iterative decoding may be used to decode headerized sub data sets having unequal error protection after the headers, and their impact on C1 parity, have been removed. To achieve this, according to one embodiment, the following steps may be performed: C1 decoding→Decoding of headers associated with rows of sub data sets→Shorten C1 codewords by removing header fragments therefrom→Modify C1 parity→iteratively [C2 decoding→C1 decoding].

In one general embodiment, a system for decoding a headerized sub data set (SDS) includes logic adapted to receive a headerized SDS protected by unequal error protection, wherein a header of the headerized SDS is protected by one level of error correction code (ECC) and data of the headerized SDS is protected by two levels of ECC; logic adapted to decode a header from the headerized SDS and removing an impact of the header from C1 row parity to obtain a SDS1(0); logic adapted to, for no more than a predetermined number of iterations: perform C2 column decoding on the SDS1(i−1), and for no more than a number of interleaves in each row of the SDS: overwrite a number of columns of the SDS with successfully decoded C2 codewords, erase a number of C2 codewords of the SDS, and maintain remaining columns of the SDS as uncorrected; perform C1 row decoding on the SDS; for no more than a number of interleaves in each row of the SDS: overwrite a number of rows of the SDS with successfully decoded C1 codewords, erase a number of C1 codewords of the SDS, and maintain remaining rows of the SDS as uncorrected; and logic adapted to output the SDS when all rows of the SDS include only C1 codewords and all columns of the SDS include only C2 codewords; otherwise, output an indication that the SDS cannot be decoded properly.

In another general embodiment, a system for decoding a headerized SDS includes logic adapted to receive a headerized SDS protected by unequal error protection, wherein a header of the headerized SDS is protected by one level of ECC and data of the headerized SDS is protected by two levels of ECC; logic adapted to perform C1' row decoding to decode a header from the headerized SDS by modifying C1' row parity of the headerized SDS by removing an impact of the header from the C1' row parity to obtain C1 row parity; logic adapted to extract the header from the headerized SDS to obtain a SDS1(0) and performing an error check on the header; logic adapted to erase the C1' row parity to indicate that C1 row parity is unknown when the header fails the error check; for no more than a predetermined number of iterations, $i \leq i\_max$, where i is an iteration counter and i_max is a maximum number of iterations: logic adapted to perform C2 column decoding on the SDS1(i−1); logic adapted to determine a number of uncorrectable C2 codewords in a current interleave, j, of a row, where the number of uncorrectable C2 codewords is U2(i,j), with $0 \leq U2(i,j) \leq N1$, where N1 is a total number of symbols in a C1 codeword; logic adapted to select a first parameter E2(i,j), such that $0 \leq E2(i,j) \leq U2(i,j)$ and $0 \leq E2(i,j) \leq (N1-K1)$, where K1 is a number of data symbols in a C1 codeword; for $1 \leq j \leq j\_max$ iterations, where j_max is a maximum number of interleaves: logic adapted to overwrite N1−U2(i,j) columns of SDS1(i,j) with successfully decoded C2 codewords, where SDS1(i−1,j) is a first calculated SDS for interleave j, logic adapted to erase E2(i,j) C2 codewords out of a total of U2(i,j) C2 codewords in SDS1(i−1,j), logic adapted to maintain U2(i,j)−E2(i,j) C2 codewords in SDS1(i−1,j) uncorrected, logic adapted to combine each interleave of overwritten and erased SDS1(i−1,j) to form SDS2(i), where SDS2(i) is a first calculated SDS for iteration i, and logic adapted to stop iterative processing when all rows of SDS2(i) include only C1 codewords and all columns of SDS2(i) include only C2 codewords and output a decoded SDS, SDS2(i); logic adapted to perform C1 row decoding on SDS2(i); logic adapted to determine a number of uncorrectable C1 codewords in the current interleave, j, where the number of uncorrectable C1 codewords is U1(i,j), with $0 \leq U1(i,j) \leq N2$, where N2 is a total number of symbols in a column; logic adapted to select a second parameter E1(i,j) such that $0 \leq E1(i,j) \leq U1(i,j)$ and $0 \leq E1(i,j) \leq (N2-K2)$, where K2 is a number of data symbols in a column; for $1 \leq j \leq j\_max$ iterations, where j_max is a maximum number of interleaves: logic adapted to overwrite N2−U1(i,j) columns of SDS2(i,j) with successfully decoded C1 codewords, where SDS2(i,j) is a second calculated SDS for interleave j, logic adapted to erase E1(i,j) C1 codewords out of a total of U1(i,j) C1 codewords in SDS2(i,j), logic adapted to maintain U1(i,j)−E1(i,j) C1 codewords in SDS2(i,j) uncorrected, logic adapted to combine each interleave of overwritten and erased SDS2(i,j) to form SDS1(i), where SDS1(i) is a second calculated SDS for iteration i, and logic adapted to stop iteratively processing when all rows of SDS1(i) include only C1 codewords and all columns of SDS1(i) include only C2 codewords and outputting a decoded SDS, SDS1(i); logic adapted to increment the iteration counter, i, by one; and logic adapted to output an indication that the headerized SDS cannot be decoded properly when the maximum number of iterations has been reached and all rows are not C1 codewords and/or all columns are not C2 codewords.

According to another general embodiment, a method for decoding a headerized SDS includes receiving a headerized SDS protected by unequal error protection, wherein a header of the headerized SDS is protected by one level of ECC and data of the headerized SDS is protected by two levels of ECC; decoding a header from the headerized SDS and removing an impact of the header from C1 row parity to obtain a SDS1(0); for no more than a predetermined number of iterations: performing C2 column decoding on the SDS1(i−1), for no more than a number of interleaves in each row of the SDS: overwriting a number of columns of the SDS with successfully decoded C2 codewords, erasing a number of C2 codewords of the SDS, and maintaining remaining columns of the SDS as uncorrected, performing C1 row decoding on the SDS; for no more than a number of interleaves in each row of the SDS: overwriting a number of rows of the SDS with successfully decoded C1 codewords, erasing a number of C1 codewords of the SDS, and maintaining remaining rows of the SDS as uncorrected; and outputting the SDS when all rows of the SDS include only C1 codewords and all columns of the SDS include only C2 codewords; otherwise, outputting an indication that the SDS cannot be decoded properly.

In yet another general embodiment, a method for encoding sub data sets includes receiving a headerized SDS protected by unequal error protection, wherein a header of the headerized SDS is protected by one level of ECC and data of the headerized SDS is protected by two levels of ECC; performing C1' row decoding to decode a header from the headerized SDS by modifying C1' row parity of the headerized SDS by removing an impact of the header from the C1' row parity to obtain C1 row parity; extracting the header from the headerized SDS to obtain a SDS1(0) and performing an error check on the header; erasing the C1' row parity to indicate that C1 row parity is unknown when the header fails the error check; for no more than a predetermined number of iterations, $i \leq i\_max$, where i is an iteration counter and i_max is a maximum number of iterations: performing C2 column decoding on the SDS1(i-1), determining a number of uncorrectable C2 codewords in a current interleave j, wherein the number of uncorrectable C2 codewords is $U2(i,j)$, with $0 \leq U2(i,j) \leq N1$, where N1 is a total number of symbols in a C1 codeword, selecting a first parameter $E2(i,j)$, where i is an iteration counter and j is a current interleave in a row, such that $0 \leq E2(i,j) \leq U2(i,j)$ and $0 \leq E2(i,j) \leq (N1-K1)$, where K1 is a number of data symbols in a C1 codeword, and for $1 \leq j \leq j\_max$ iterations, where j_max is a maximum number of interleaves: overwriting $N1-U2(i,j)$ columns of SDS1(i,j) with successfully decoded C2 codewords, where SDS1(i,j) is a first calculated SDS for interleave j, erasing $E2(i,j)$ C2 codewords out of a total of $U2(i,j)$ C2 codewords in SDS1(i-1,j), maintaining $U2(i,j)-E2(i,j)$ C2 codewords in SDS1(i,j) uncorrected, combining each interleave of SDS1(i,j) to form SDS1(i), where SDS2(i) is a first calculated SDS for iteration i, and stopping the method when all rows of SDS2(i) include only C1 codewords and all columns of SDS2(i) include only C2 codewords and outputting a decoded SDS, SDS2(i); performing C1 row decoding on SDS2(i); determining a number of uncorrectable C1 codewords in the current interleave j, wherein the number of uncorrectable C1 codewords is $U1(i,j)$, with $0 \leq U1(i,j) \leq N2$, where N2 is a total number of symbols in a column; selecting a second parameter $E1(i,j)$ such that $0 \leq E1(i,j) \leq U1(i,j)$ and $0 \leq E1(i,j) \leq (N2-K2)$, where K2 is a number of data symbols in a column; and for $1 \leq j \leq j\_max$ iterations, where j_max is a maximum number of interleaves: overwriting $N2-U1(i,j)$ columns of SDS2(i,j) with successfully decoded C1 codewords, where SDS2(i,j) is a second calculated SDS for interleave j, erasing $E1(i,j)$ C1 codewords out of a total of $U1(i,j)$ C1 codewords in SDS2(i,j), maintaining $U1(i,j)-E1(i,j)$ C1 codewords in SDS2(i,j) uncorrected, combining each interleave of overwritten and erased SDS2(i,j) to form SDS1(i), where SDS1(i) is a second calculated SDS for iteration i, and stopping the method when all rows of SDS1(i) include only C1 codewords and all columns of SDS1(i) include only C2 codewords and outputting a decoded SDS, SDS1(i); and incrementing the iteration counter, i, by one; and outputting an indication that the headerized SDS cannot be decoded properly when the maximum number of iterations has been reached and all rows are not C1 codewords and/or all columns are not C2 codewords.

According to yet another general embodiment, a computer program product for decoding a headerized SDS includes a computer readable storage medium having program code embodied therewith, the program code readable/executable by a tape drive to: receive, by the tape drive, a headerized SDS protected by unequal error protection, wherein a header of the headerized SDS is protected by one level of ECC and data of the headerized SDS is protected by two levels of ECC; decode, by the tape drive, a header from the headerized SDS and removing an impact of the header from C1 row parity to obtain a SDS1(0); for no more than a predetermined number of iterations: perform, by the tape drive, C2 column decoding on the SDS1(i-1), and for no more than a number of interleaves in each row of the SDS: overwrite, by the tape drive, a number of columns of the SDS with successfully decoded C2 codewords, erase, by the tape drive, a number of C2 codewords of the SDS, and maintain, by the tape drive, remaining columns of the SDS as uncorrected; perform, by the tape drive, C1 row decoding on the SDS; for no more than a number of interleaves in each row of the SDS: overwrite, by the tape drive, a number of rows of the SDS with successfully decoded C1 codewords, erase, by the tape drive, a number of C1 codewords of the SDS, and maintain, by the tape drive, remaining rows of the SDS as uncorrected; and output, by the tape drive, the SDS when all rows of the SDS include only C1 codewords and all columns of the SDS include only C2 codewords; otherwise, output an indication that the SDS cannot be decoded properly.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as "logic," a "circuit," a "module," or a "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a non-transitory computer readable storage medium. A non-transitory computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device, such as an electrical connection having one or more wires, an optical fiber, etc.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to FIG. 1, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in the network storage system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
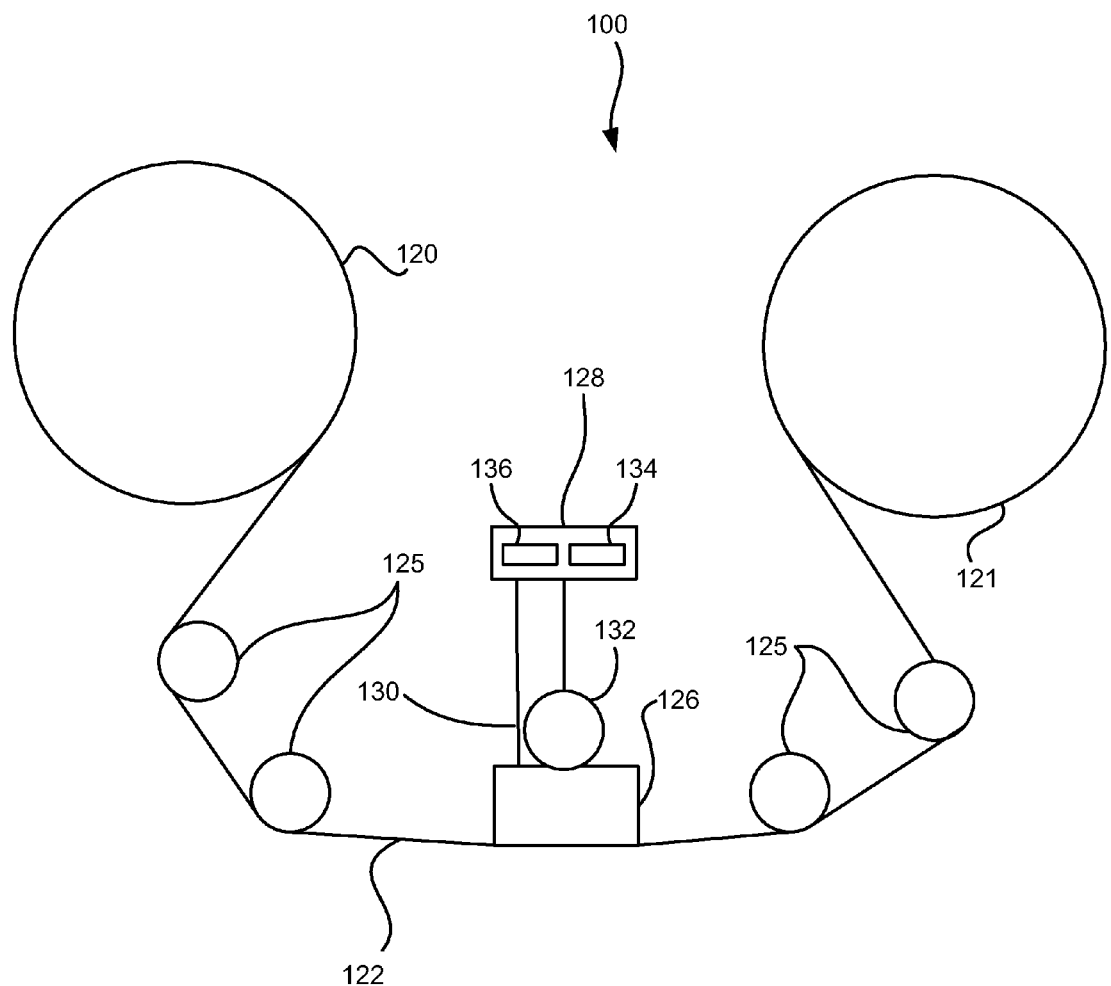
FIG. 2 illustrates a simplified tape drive of a tape-based data storage system, according to one embodiment.

FIG. 2 illustrates a simplified tape drive 100 of a tape-based data storage system, which may be employed according to various embodiments. While one specific implementation of a tape drive is shown in FIG. 2, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 2, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically comprises a servo channel 134 and data channel 136 which includes data flow processing. It controls reel motion (not shown in FIG. 2) and head functions, such as track following, writing, reading, etc. The cable 130 may include read/write circuits to transmit data to the head 126 to be recorded on the tape 122 and to receive data read by the head 126 from the tape 122. An actuator 132 moves the head 126 to a set of tracks on the tape 122 in order to perform a write or a read operation.

An interface may also be provided for communication between the tape drive 100 and a host (integral or external) to send and receive the data and for controlling the operation of the tape drive 100 and communicating the status of the tape drive 100 to the host, as would be understood by one of skill in the art.

ECC is used in data storage to achieve very low bit error rates, e.g., magnetic tape storage products are designed to ensure bit error rates in the range of $1 \times 10^{-17}$ to $1 \times 10^{-19}$ under normal operating conditions. Linear block codes, such as Reed-Solomon (RS) codes and low-density parity-check (LDPC) codes, have generally been preferred ECC schemes used in data storage products.

Conventionally, RS encoders at a transmitter (a write side in the context of data storage) take a number of information symbols (K) at an input of the encoder, where each symbol consists of a number of bits (m), with a preferred choice for the size of m being eight, e.g., in one embodiment, m=8, with the symbols being bytes. The RS encoder then generates, in a first step, a number of N−K symbols, which are known as "parity symbols," "overhead," or "redundancy," as a linear function of the K input symbols and appends, in a second step, the generated (N−K) parity symbols at an end of the K information symbols to obtain an N-symbol RS codeword.

This is referred to as generating codewords from a RS(N, K) code. The minimum Hamming distance (d) of a RS(N,K) code is d=N−K+1. This means that any two RS(N,K) codewords differ by d or more symbols, where there are a total of $(2^m)^K$ RS(N,K) codewords. RS(N,K) codes may also be referred to as RS(N,K,d) codes, thereby including the indication of the Hamming distance in the notation. The m-bit symbols of an RS code are from a Galois field (GF) with $2^m$ symbols. Therefore, RS codes may also be referred to as RS(N,K,d) codes over $GF(2^m)$. The RS parity symbols may be generated using a linear feedback shift register circuit, or some other technique known in the art. A RS encoder which uses a linear feedback shift register circuit, which appends generated parity symbols to the information symbols, is known in the art as a "systematic encoder."

A RS decoder for a RS(N,K,d) code over $GF(2^m)$ at a receiver (a read side in the context of data storage) is capable of correcting up to t symbols, where t=floor((N−K)/2). In other words, up to t symbols in an N-symbol RS codeword may be corrupted and the RS decoder is still capable of correcting these t erroneous symbols. For any given set of data, it is likely that a group of up to t symbols will contain errors, where each erroneous m-bit symbol contains at least 1 bit error and at most m bit errors. This RS decoder has an error correction capability of t. Sometimes, the RS decoder may use additional information about locations of erroneous symbols within a codeword. In other words, the RS decoder is aware of which symbols are in error but does not know how many bits, nor which bits in the erroneous symbols are wrong. This is the case for erasure correction. The RS decoder is capable of correcting e erased symbols, where e=(N−K). In this case, the RS decoder is aware of locations of the erroneous symbols. In general, the RS decoder is capable of correcting e' erased symbols and t' erroneous symbols with unknown locations when (e'+2t')≤d, where d=(N−K+1).

If there are t=floor((N−K)/2) or less erroneous symbols (or e=(N−K) or less erased symbols) in a RS codeword (in the most general case: (e'+2t')≤d=(N−K+1)), a bounded-distance RS decoder (in practice, most RS decoders are of a bounded-distance type) corrects all erroneous symbols and erased symbols. If there are more than t erroneous symbols (or more than e erased symbols) in a RS codeword (in the most general case: (e'+2t')>(N−K)), two things may occur at the output of the bounded-distance RS decoder.

The most likely occurrence is that the RS decoder raises a decoding failure flag which indicates that the total number of erroneous symbols and erased symbols exceeds the error correction capability of the RS decoder. In a less likely outcome, the total number of erroneous symbols and erased symbols may cause the receiver's corrupted RS codeword to become very close to another RS codeword and the RS decoder may correct the errors and the erased symbols and output an erroneous RS codeword. In this case, a "miscorrection" occurred and the RS decoder is not aware that a mistake was made. The most likely miscorrection case is when the decoded RS codeword differs in d=N−K+1 symbols from the original RS codeword. Finally, the RS decoder drops the parity symbols from the decoded RS codeword to recover the information symbols.

Figure 3:
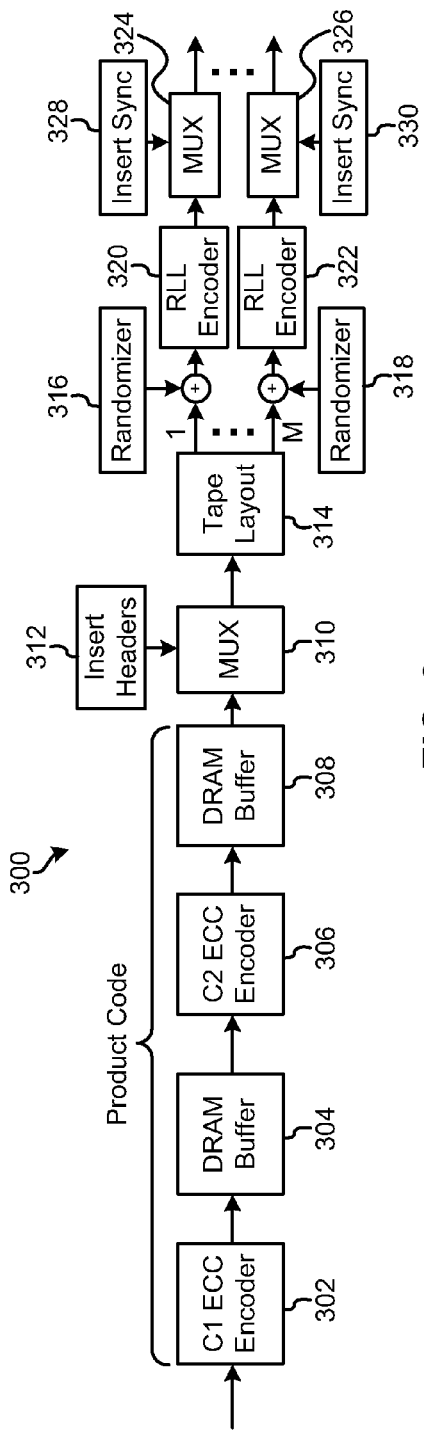
FIG. 3 shows a system for encoding data, according to one embodiment.

Now referring to FIG. 3, a system 300 for encoding data in a tape drive with M simultaneously written tracks is shown, including the operations of a C1 error correction code (ECC) encoder module 302, a DRAM buffer 304, C2 ECC encoder module 306, a second DRAM buffer 308 (which may be the same or different from DRAM buffer 304), a multiplexer 310 for adding headers 312 to encoded data, and tape layout addition module 314, according to one embodiment. The system 300 also includes scrambling (e.g., randomizers 1 to M adapted for data randomization in each channel) 316, . . . , 318, run-length limited (RLL) encoder modules 320, . . . , 322, individual channel multiplexers 324, . . . , 326 for inserting synchronization 328, . . . , 330 for each track 1, . . . , M. Any number of tracks may be written to a magnetic medium, such as 4 tracks, 8 tracks, 16 tracks, 32 tracks, 64 tracks, etc. Furthermore, any type of storage medium may be used, such as magnetic tape, optical disk (such as CD-ROM, DVD-ROM, Blu-Ray, etc.), hard disk, etc.

In one approach, the storage medium may be a magnetic tape, and the system 300 may comprise logic adapted for parsing the encoded data into a plurality of tracks prior to writing the encoded data to the magnetic tape, such as the tape layout addition module 314, in one embodiment.

In FIG. 3, the C1 ECC encoder module 302, the DRAM buffer 304, the C2 ECC encoder module 306, and the second DRAM buffer 308 may be used for inserting a product code into sub data sets (SDS).

In the following descriptions, most of these operations are not shown to simplify description as the C1 parity and C2 parity in the ECC encoding are the focus of the descriptions. However, any of the descriptions herein may include additional operations not depicted, but described in other figures.

Figure 4:
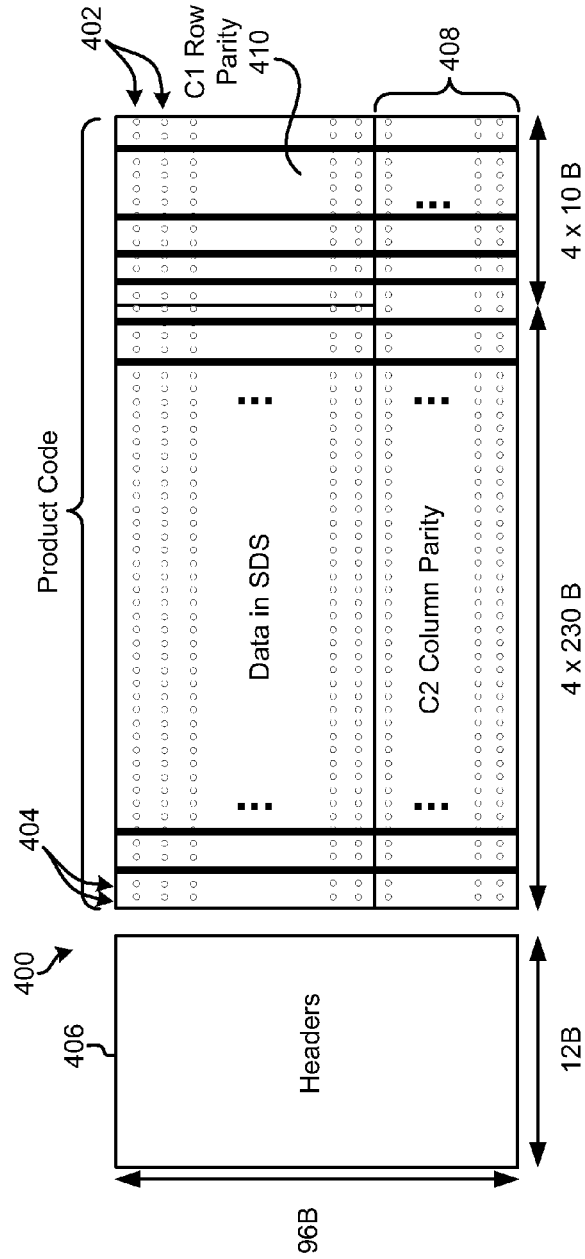
FIG. 4 shows an encoded sub data set (SDS) unit, according to one embodiment.

Each data set in the received data which is processed according to any embodiment described herein includes multiple subunits or SDS and each SDS is a two-dimensional array 400 shown in FIG. 4 with rows 402 and columns 404. Each row 402 in the array 400 comprises one or more C1 codewords, while each column 404 in the array 400 comprises one or more C2 codewords. In linear tape open (LTO), each encoded-SDS includes two (for generations LTO 1-LTO 4) or four (LTO 5 and later) C1 codewords in the rows 402. However, anywhere from one to eight or more C1 codewords may be included in each row 402 of the SDS array 400. Usually, hundreds or even thousands of headers 406 are assigned to a single data set because each data set includes multiple SDS and each row 402 of a column-encoded SDS is assigned a header 406.

As shown in FIG. 4, since the C1 encoding takes place prior to the C2 ECC encoding, the C2 column parity 408 extends along the entire length of each row 402 in the C2 column parity portion of the array 400. The C1 row parity 410 is positioned at the end of each row 402 outside of the C2 column parity area 408 of the array 400. However, as indicated in FIG. 4 the dotted lines in the C2 column parity area 408 are C1 codewords. This is a property of the product code construction where the order of C1 and C2 extension may be interchanged without having an impact on the product code, i.e., all rows are from one code and all columns are from another code independent of the order of C1 and C2 extension.

According to one embodiment, where each row 402 may include four C1 codewords interleaved into the entirety of the row 402, referred to as a CWI-4. Each C1 codeword may be 230 bytes long, with the additional C1 parity adding an additional 10 bytes. Since four C1 codewords are interleaved in each row 402 in this embodiment, each row 402 (a row is one CWI-4) has 4×230 bytes+4×10 bytes=960 bytes. Furthermore, in this embodiment, there may be 96 rows 402 in each SDS array 400, or more or less rows 402 in other embodiments.

In addition, the headers 406, in one approach, may be 12 bytes long, with 96 rows 402 of headers 406 being present in this embodiment. This results in a total size of a SDS two-dimensional array 400 being 93,312 bytes, with no ECC encoding for the headers 406.

Furthermore, in one approach, the C1 ECC encoding scheme may comprise a RS(240,230,11) code over GF(256), and the C2 ECC may comprise a RS(96,84,13) code over GF(256).

Referring now to FIGS. 3-4, in one embodiment, a system 300 for encoding data may comprise logic adapted for receiving data comprising one or more SDS, a C1 ECC encoder module 302 adapted for generating a plurality of C1 codewords during C1 ECC encoding of the one or more SDS, each of the C1 codewords comprising a plurality of symbols. In some embodiments, the symbols may be bytes (8-bit symbols where the bits take values 0 or 1), although other symbols may be used in other embodiments. The system 300 may also include logic adapted for interleaving the plurality of C1 codewords into C1 codeword interleaves (CWIs), such as the multiplexer 310. Each CWI has a predetermined number of C1 codewords interleaved therein, and as shown in FIG. 4, there are four C1 codewords interleaved in each row (CWI-4) 402, but any number of codewords may be interleaved, such as two, six, eight, ten, etc.

In order to interleave C1 codewords into each row 402, what happens is that a first byte of each codeword is paced in the row, followed by the second byte of each codeword, followed by the third byte of each codeword, and each subsequent byte from each codeword interleaved together so that all codewords' first bytes are together, all second bytes, all third bytes, . . . , and then all last bytes of each of the codewords. In one embodiment, the positioning of the interleaves is different across different rows 402 in the array 400 so that the bits from the first interleave are not always in a column 404 together.

In other words, the logic adapted for interleaving the plurality of C1 codewords into the CWIs 402 comprises logic adapted for byte-interleaving a same number of C1 codewords together into each CWI 402. The number of C1 codewords interleaved together may range from two to eight C1 codewords or more.

The tape layout interleaves C2 and C1 codewords and thus decorrelates byte errors at the C2 decoder input. In one approach, a 6 MB data set (DS) may include 64 SDS which are the basic ECC data units. The tape layout also associates headers to SDS rows (~1 kB packet) and assigns each packet to one of the logical tracks, e.g., to one of 32 logical tracks. An error rate of less than $1 \times 10^{-3}$ at the C2 decoder input translates to an error rate of less than $1 \times 10^{-17}$ at the C2 decoder output. A 32-track tape layout design has good decorrelation properties. An improved decorrelation due to a 50% increase over the LTO-5 minimum packet spacing is possible with embodiments described herein.

The system 300 also includes a C2 encoder module 306 adapted for generating a plurality of C2 codewords during C2 ECC encoding of the one or more SDS, each of the C2 codewords comprising a plurality of symbols. The C2 codewords are represented by columns 404 in the array 400, with each column 404 including a portion of one, exactly one, or more C2 codewords, according to various embodiments. However, in this embodiment, each C2 codeword has at most one symbol from each C1 codeword in each CWI (each row 402) and each column 404 is exactly one C2 codeword.

Also, the system 300 comprises logic adapted for writing the one or more encoded SDS to the storage medium. This logic may be included in the tape layout addition module 314, randomizers 316, 318, RLL encoders 320, 322, multiplexers 324, 326, and sync pattern insertion 328, 330, in one approach.

In system 300, the C1 ECC encoding is performed prior to the C2 ECC encoding, which results in SDS encoding as shown in FIG. 4, according to one embodiment.

Figure 5:
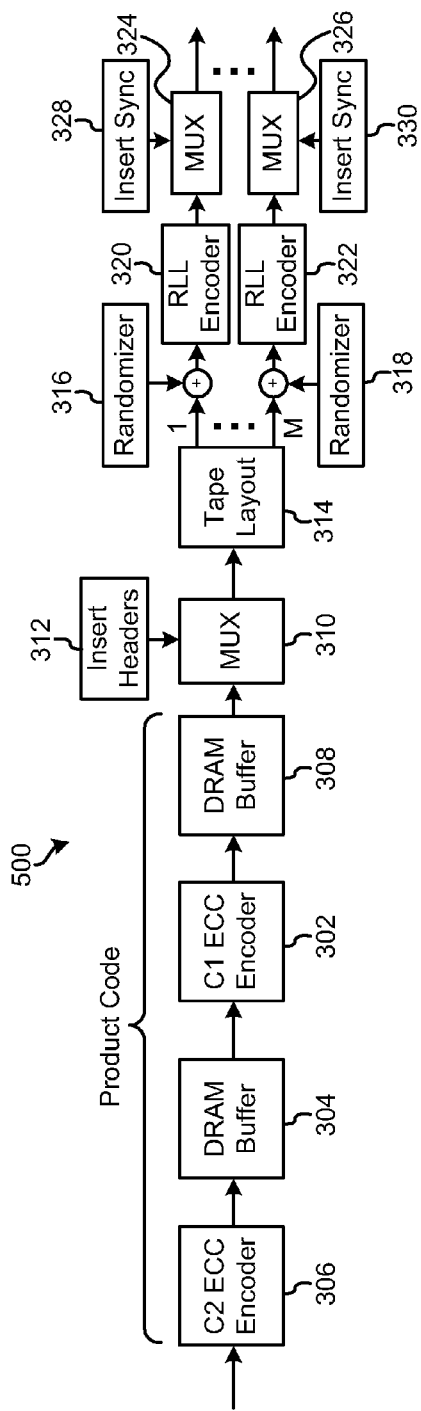
FIG. 5 shows a system for encoding data, according to one embodiment.
Figure 6:
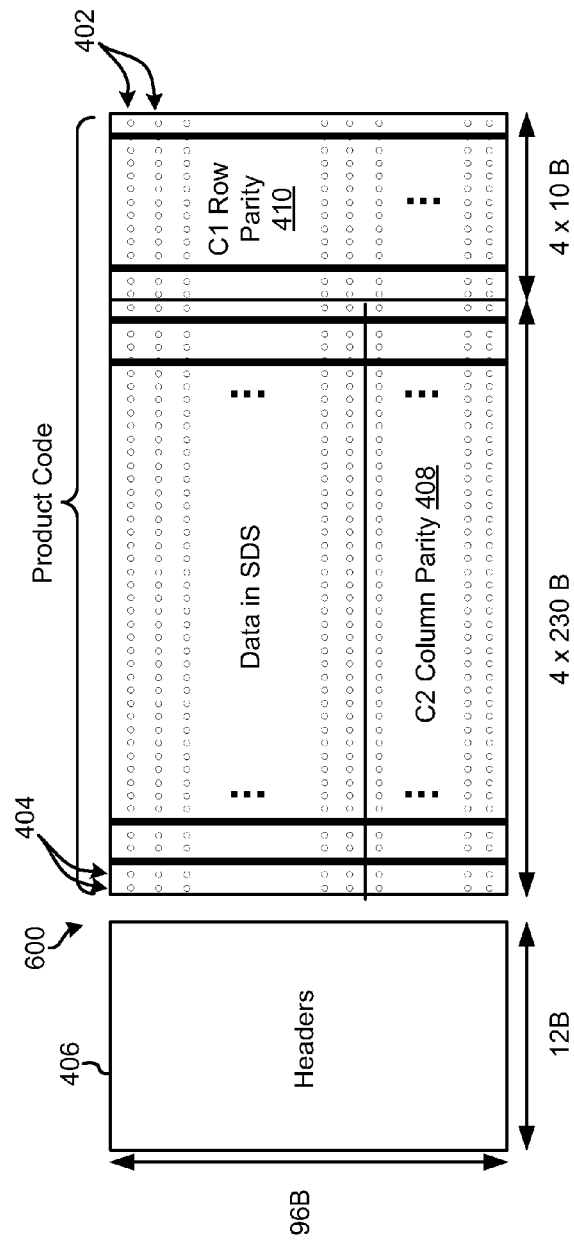
FIG. 6 shows an encoded SDS unit, according to one embodiment.

According to another embodiment, as shown in FIGS. 5-6, a system 500 may have the C2 ECC encoding (using the C2 ECC encoder module 306) performed prior to the C1 ECC encoding (using the C1 ECC encoder module 302), which results in SDS encoding as shown in FIG. 6, according to one embodiment. Although C2 encoding is performed first, the columns in the C1 row parity area 410 in FIG. 6 are C2 codewords indicated by solid vertical lines in the C1 row parity area 410. This is a property of product code construction.

However, just as in array 400 in FIG. 4, array 600 in FIG. 6 has headers 406 that are not encoded.

In this embodiment, it is possible to also have a C2 encoder module 306 adapted for generating a plurality of C2 codewords during C2 ECC encoding of the one or more SDS. The C2 codewords are represented by columns 404 in the array 600, with each column 404 including a portion of one, exactly one, or more C2 codewords, according to various embodiments. However, in this embodiment, each C2 codeword has at most one symbol from each C1 codeword in each CWI (each row 402) and each column 404 is exactly one C2 codeword.

Furthermore, in one approach, the C1 ECC encoding scheme may comprise a RS(240,230,11) code over GF(256), and the C2 ECC may comprise a RS(96,84,13) code over GF(256).

Figure 7:
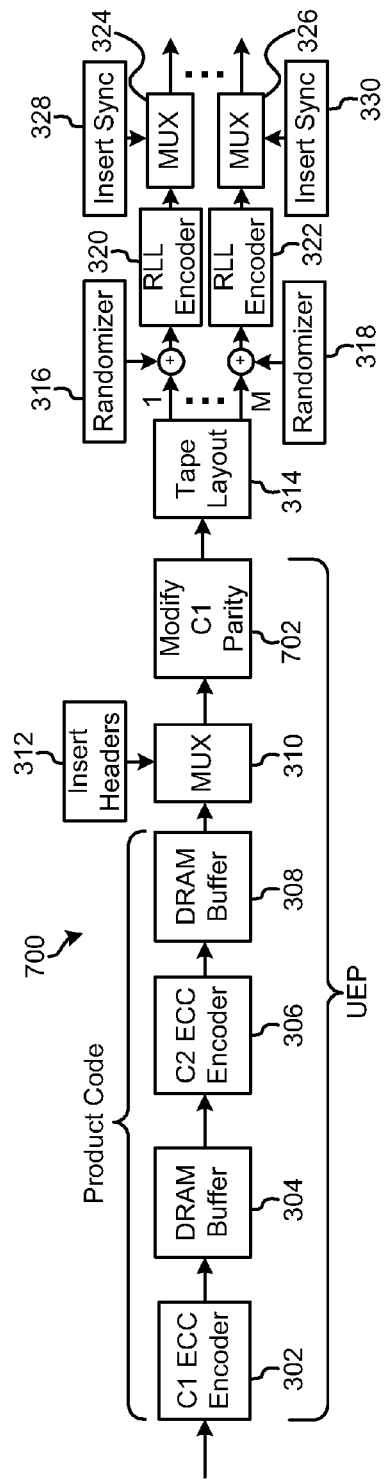
FIG. 7 shows a system for encoding data, according to one embodiment.
Figure 8:
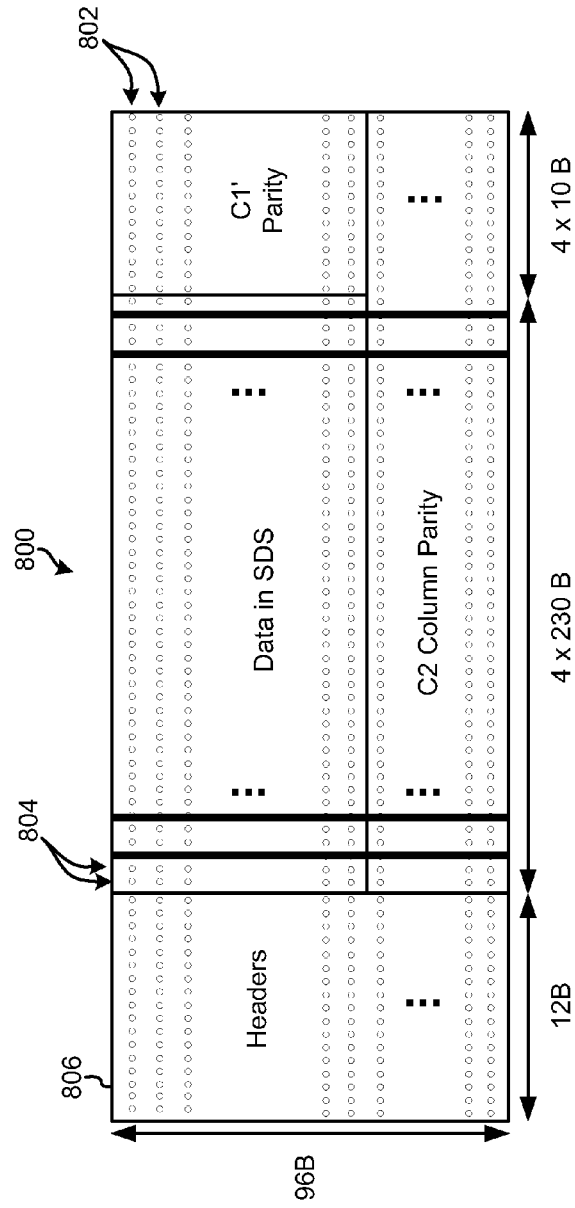
FIG. 8 shows an encoded SDS unit, according to one embodiment.

According to another embodiment, as shown in FIGS. 7-8, a system 700 may include all modules and logic that is present in FIG. 3, described previously. However, in the embodiment shown in FIGS. 7-8, the headers 806 may be encoded using a C1 encoding scheme by modifying the C1 row parity to account for the headers 806 using a C1 parity modifying module 702. This may be referred to as a concatenated code with unequal error protection (UEP). In this embodiment, the headers are protected by one-level ECC whereas the data is protected by two-level ECC.

In other words, the system 700 may also include logic adapted for adding a header 806 to each of the one or more SDS, and logic adapted for modifying the plurality of C1 codewords to account for inclusion of the headers.

In this embodiment, each header 806 includes encoding, which adds 12 bytes to each of the CWI. When four codewords are included in each row 802, 3 bytes are added to each of the four C1 codewords in a CWI.

However, just as in the previous embodiments, each C2 codeword has at most one symbol from each C1 codeword in each CWI (each row 802) and each column 804 is exactly one C2 codeword.

Figure 9:
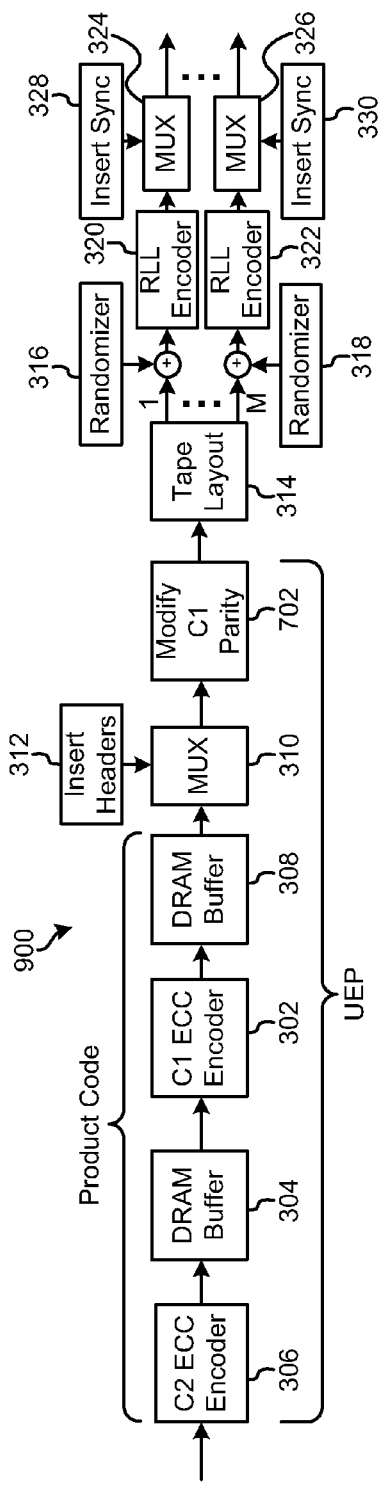
FIG. 9 shows a system for encoding data, according to one embodiment.
Figure 10:
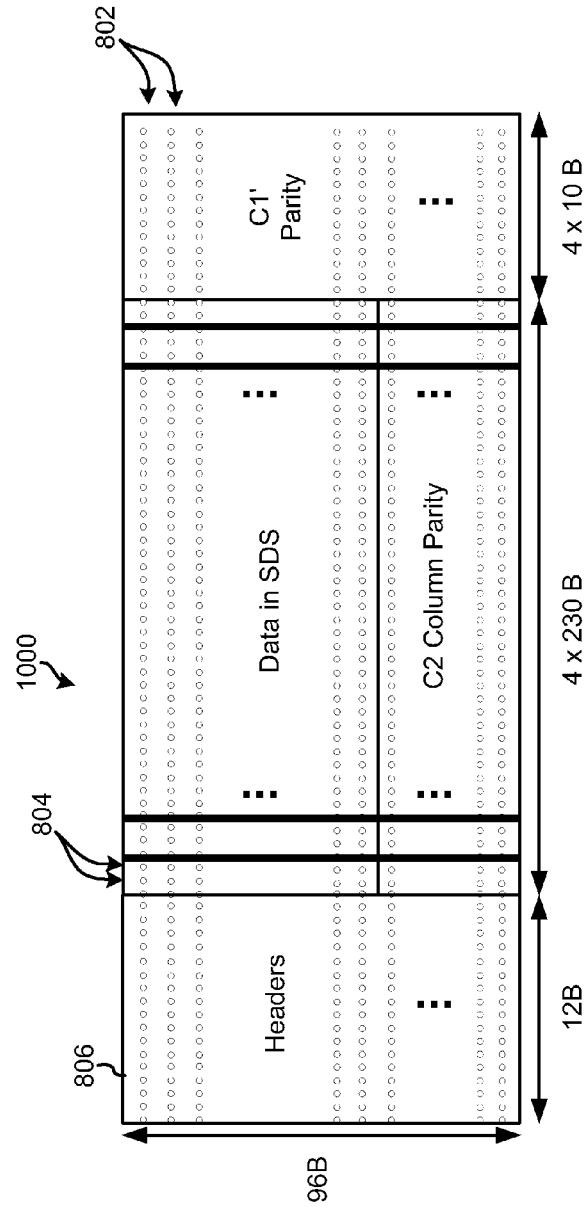
FIG. 10 shows an encoded SDS unit, according to one embodiment.

Now referring to FIGS. 9-10, a system 900 may include all modules and logic that is present in FIG. 5, described previously. However, in the embodiment shown in FIGS. 9-10, the headers 806 may be encoded using a C1 encoding scheme by modifying the C1 row parity to account for the headers 806 using a C1 parity modifying module 702. This may be referred to as a concatenated code with UEP. In this embodiment, the headers are protected by one-level ECC whereas the data is protected by two-level ECC.

In other words, the system 900 may also include logic adapted for adding a header 806 to each of the one or more SDS, and logic adapted for modifying the plurality of C1 codewords to account for inclusion of the headers.

In this embodiment, the C2 column parity do not extend across the entirety of the array 1000, as the modified C1 row parity exists in each row 802 of the array 1000. Furthermore, each header 806 includes encoding, which adds 12 bytes to each of the CWI. When four codewords are included in each row 802, 3 bytes are added to each of the C1 codewords.

However, just as in the previous embodiments, each C2 codeword has at most one symbol from each C1 codeword in each CWI (each row 802) and each column 804 is exactly one C2 codeword.

Figure 11A:
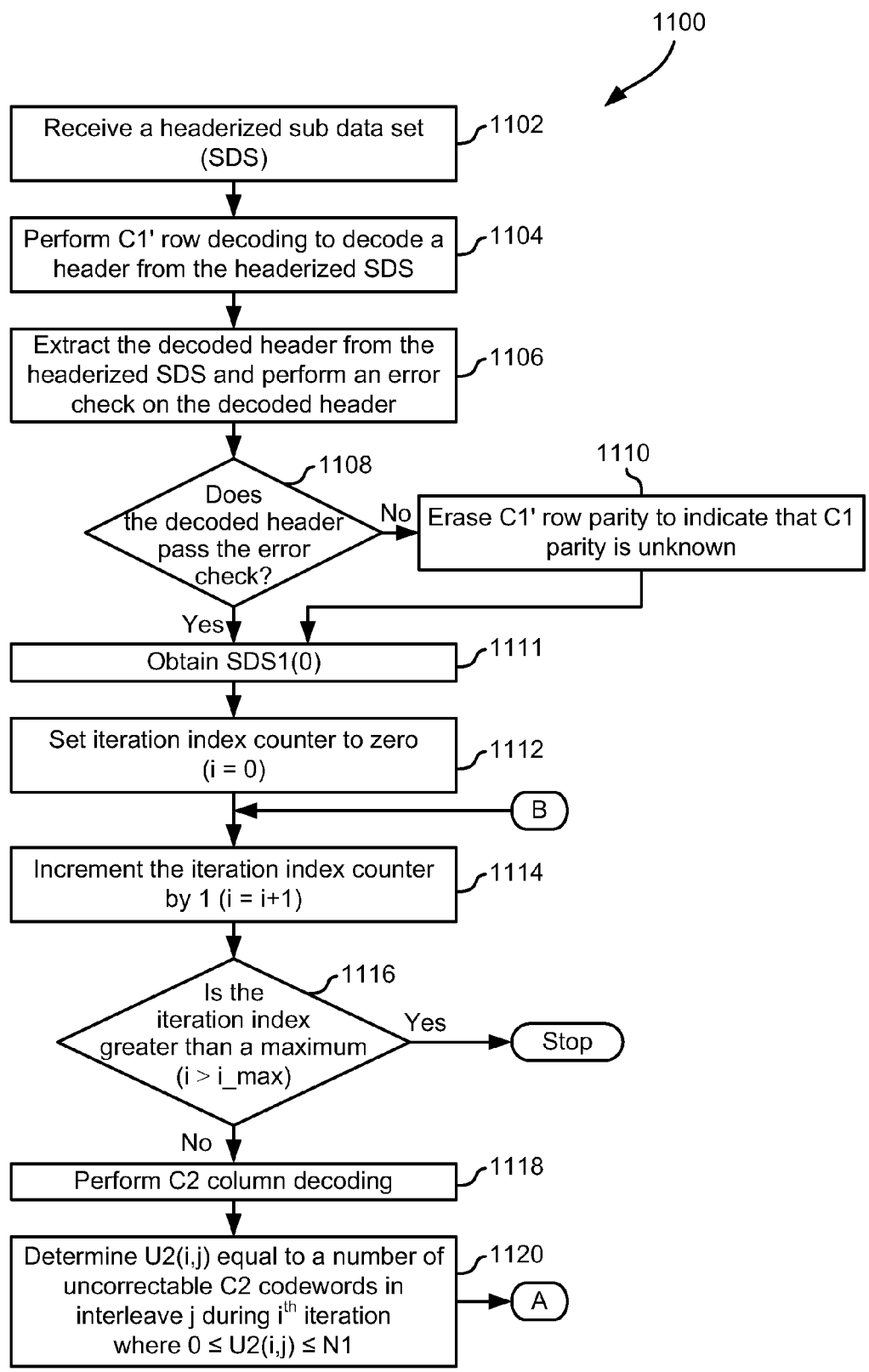
FIGS. 11A-11B show a flowchart of a method, according to one embodiment.
Figure 11B:
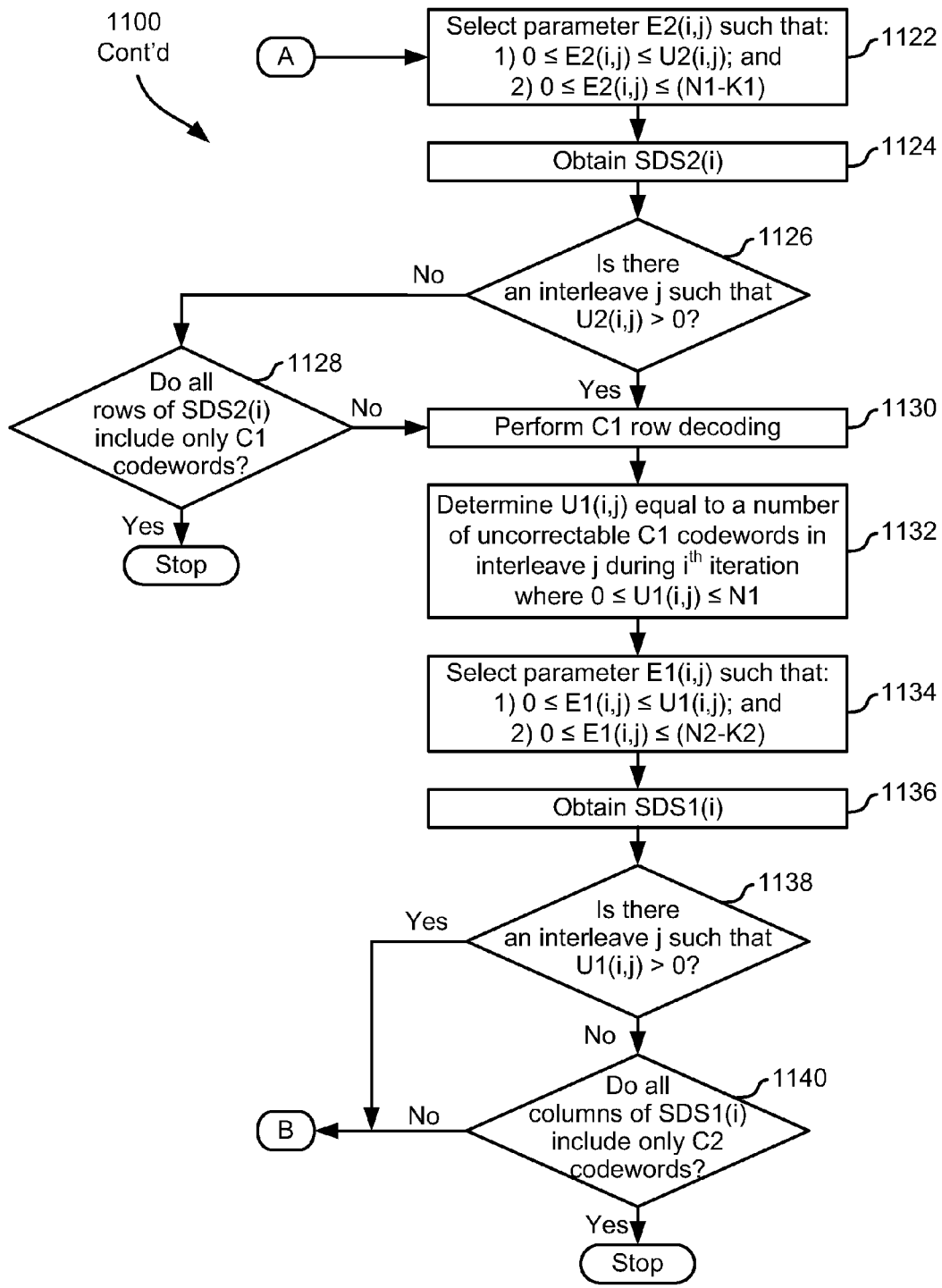

Now referring to FIG. 11, a method 1100 for decoding a SDS is shown according to one embodiment. The method 1100 may be performed in accordance with the present invention in any of the environments depicted in FIGS. 1-10 and 12-14, among others, in various embodiments. Of course, more or less operations than those specifically described in FIG. 11 may be included in method 1100, as would be understood by one of skill in the art upon reading the present descriptions.

Each of the steps of the method 1100 may be performed by any suitable component of the operating environment. For example, in various non-limiting embodiments, the method 1100 may be partially or entirely performed by a C1/C2 encoding/decoding system, a tape drive, a hard disk drive, an optical drive, a processor (such as a CPU, an ASIC, a FPGA, etc.) which may be embedded in and/or operate within a system, etc.

As shown in FIG. 11, method 1100 may initiate with operation 1102, where a headerized SDS protected by unequal error protection is received. A header of the headerized SDS is protected by one level of ECC and data of the headerized SDS is protected by two levels of ECC.

In operation 1104, a header is decoded from the headerized SDS and an impact of the decoded header is removed from C1 row parity, in order to obtain a SDS.

In operation 1106, the decoded header is extracted from the headerized SDS to obtain a SDS1(0) and an error check, such as a cyclic redundancy check (CRC), is performed on the decoded header.

In operation 1108, it is determined whether the decoded header passes the error check. If so, the method 1100 continues to operation 1112; otherwise, operation 1110.

In operation 1110, the C1' row parity is erased to indicate that C1 row parity is unknown when the decoded header fails the error check. Strictly speaking, C1 codewords do not include header fragments, whereas C1' codewords include header fragments. In other words, if the C1 code is (N1, K1) code and a header contains H symbols (e.g., H bytes) and there are j_max interleaves in an SDS row, C1' code is (N1+H/j_max, K1). In this text, C1 code is sometimes used for C1' code. However, from the context of the code described, it should be clear which code is meant.

For example, assume R headers in a received SDS are recovered and Q=N2-R headers in the SDS are not recovered. The received initial SDS is referred to as SDS2(0). Moreover, among Q non-recovered headers, there are P decoded CWI-4 designations, where $0 \le P \le Q$, that indicate the position of a SDS row within the data set, i.e., although Q headers could not be recovered, P header parts were able to be recovered that indicate the position of these P SDS rows within the data set. Following C1' decoding, a parameter E'(j) may then be selected such that: 1) $0 \le E'(j) \le U'(j)$, and 2) $0 \le E'(j)+(Q-P) \le (N2-K2)$ are satisfied, where U'(j) is a number of uncorrectable C1' codewords in interleave j (j=1, 2, 3, 4 is a preferred choice indicating four interleaves).

In operation 1111, SDS1(0) is obtained. In one embodiment, SDS1(0) may be obtained according to the following description.

According to one embodiment, SDS1(0) is obtained from the received SDS2(0) by iteratively, for $1 \leq j \leq j\_max$ iterations, where j_max is a maximum number of interleaves: overwriting N2−U'(j) rows of received SDS2(0,j) with successfully decoded C1' codewords; erasing E'(j) C1' codewords out of a total of U'(j) uncorrectable C1' codewords in SDS2(0,j); maintaining U'(j)−E'(j) C1' codewords in SDS2(0,j) uncorrected; and combining each interleave of modified SDS2(0,j) to form SDS1(0).

In operation 1112, an iteration index counter, i, is set to zero in order to begin iterative processing.

In operation 1114, the iteration index counter is incremented by 1, e.g., i=i+1.

In operation 1116, it is determined whether the iteration index counter, i, is greater than a maximum number of iterations, i_max, e.g., i>i_max. If the iteration index counter, i, is greater than the maximum number of iterations, i_max, the method 1100 is stopped, and an indication that the headerized SDS cannot be decoded properly is output. Otherwise, the method 1100 continues to operation 1118.

In operation 1118, C2 column decoding is performed on the SDS1(i−1).

In operation 1120, a number of uncorrectable C2 codewords in the current interleave j is determined, where the number of uncorrectable C2 codewords is U2(i,j), with $0 \leq U2(i,j) \leq N1$, where N1 is a total number of symbols in a C1 codeword.

In operation 1122, a first parameter E2(i,j) is selected, where i is the iteration index counter and j is a current interleave in a row, such that $0 \leq E2(i,j) \leq U2(i,j)$ and $0 \leq E2(i,j) \leq (N1-K1)$. U2(i,j) is the number of uncorrectable C2 codewords in the current interleave j, and K1 is a number of data symbols in a C1 codeword.

In operation 1124, SDS2(i) is obtained. According to one embodiment, SDS2(i) is obtained from SDS1(i−1) by iteratively, for $1 \leq j \leq j\_max$ iterations, where j_max is a maximum number of interleaves: overwriting N1−U2(i,j) columns of SDS1(i−1,j) with successfully decoded C2 codewords, where SDS1(i−1,j) is a first calculated SDS for interleave j; erasing E2(i,j) C2 codewords out of a total of U2(i,j) C2 codewords in SDS1(i−1,j); maintaining U2(i,j)−E2(i,j) C2 codewords in SDS1(i−1,j) uncorrected; and combining each interleave of the overwritten and erased SDS1(i−1,j) to form SDS2(i).

In operation 1126, it is determined whether an interleave j exists where U2(i,j)>0. If so, the method 1100 continues to operation 1130; otherwise, U2(i,j)=0 for $1 \leq j \leq j\_max$ and the method 1100 continues to operation 1128.

In operation 1128, it is determined whether all rows of SDS2(i) include only C1 codewords. More than one C1 codeword may be included in each row, e.g., four C1 codewords in a CWI-4. All columns of SDS2(i) include only C2 codewords because U2(i,j)=0 for $1 \leq j \leq j\_max$. If so, a decoded SDS, SDS2(i), is output and the method 1100 ends; otherwise, the method 1100 continues to operation 1130.

In operation 1130, C1 row decoding is performed on SDS2(i).

In operation 1132, a number of uncorrectable C1 codewords in the current interleave, j, is determined, where the number of uncorrectable C1 codewords is U1(i,j), with $0 \leq U1(i,j) \leq N2$, where N2 is a total number of symbols in a column.

In operation 1134, a second parameter E1(i,j) is selected such that $0 \leq E1(i,j) \leq U1(i,j)$ and $0 \leq E1(i,j) \leq (N2-K2)$, where K2 is a number of data symbols in a column.

In operation 1136, SDS1(i) is obtained. In one embodiment, SDS1(i) is obtained from SDS2(i) by iteratively, for $1 \leq j \leq j\_max$ iterations, where j_max is a maximum number of interleaves: overwriting N2−U1(i,j) rows of SDS2(i,j) with successfully decoded C1 codewords, where SDS2(i,j) is a second calculated SDS for interleave j; erasing E1(i,j) C1 codewords out of a total of U1(i,j) C1 codewords in SDS2(i,j); maintaining U1(i,j)−E1(i,j) C1 codewords in SDS2(i,j) uncorrected; combining each interleave of overwritten and erased SDS2(i,j) to form SDS1(i).

In operation 1138, it is determined whether an interleave exists where U1(i,j)>0. If so, the method 1100 returns to operation 1114; otherwise, the method 1100 continues to operation 1140.

In operation 1140, all rows of SDS1(i) consist of C1 codewords because U1(i,j)=0 for $1 \leq j \leq j\_max$. Therefore, it is only determined whether all columns of SDS1(i) are C2 codewords. If so, a decoded SDS, SDS1(i), is output and the method 1100 ends; otherwise, the method 1100 returns to operation 1114.

In one embodiment, the header of the headerized SDS may be protected by C1 encoding and data of the headerized SDS may be protected by C1 encoding and C2 encoding.

It should also be noted that, in some alternative implementations, the functions noted in the block may occur out of the order noted in the figures. For example, two blocks shown in succession may, in fact, be executed substantially concurrently, or the blocks may sometimes be executed in a reverse order, depending upon the functionality involved. For example, in another embodiment, after first performing C1' decoding, removing header impact and C2 decoding with E'(j)=U'(j), a valid SDS may not be obtained. If so, instead of performing C1 decoding, it may be more beneficial to again perform C2 decoding with a SDS1(0) generated assuming E'(j)=0, and then continue by C1 decoding and C2 decoding iteratively.

According to various embodiments, the method 1100 may be performed by a system via logic executing each operation, by a computer program product, or by some other device or system. The computer program product may include a computer readable storage medium having program code embodied therewith, and the program code may be readable/executable by a tape drive to cause the method 1100 to be performed.

Figure 12:
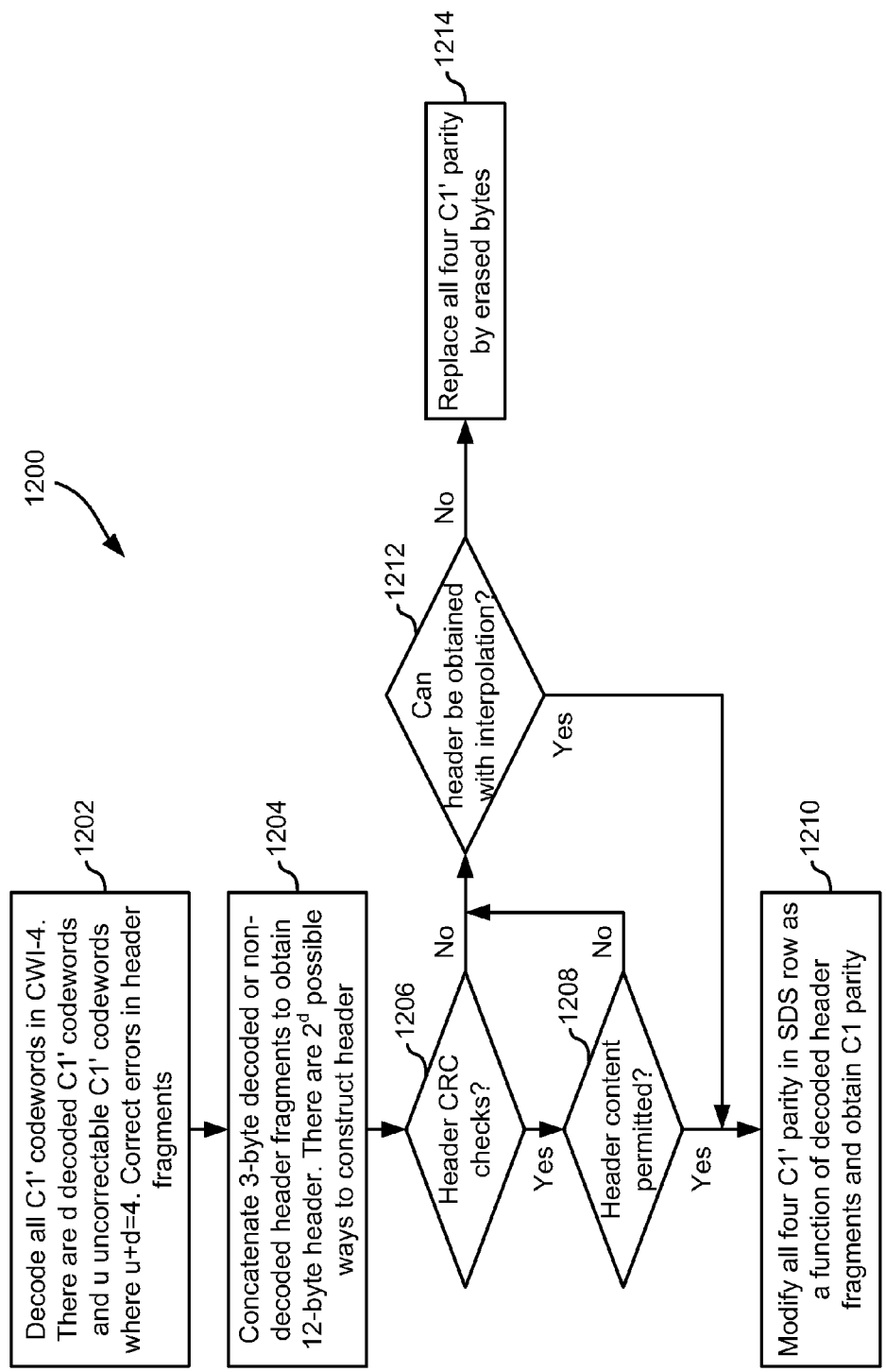
FIG. 12 is a flowchart of a method according to one embodiment.

Now referring to FIG. 12, a method 1200, which may be a more detailed description of operations 1104-1110, is shown according to one embodiment. The method 1200 may be used to extract a header from an unequally protected headerized SDS, in one approach. The method 1200 begins with operation 1202, where all C1' codewords in a given interleave (in this example a four codeword interleave, CWI-4) are decoded. There are d decoded C1' codewords and u uncorrectable C1' codewords, where u+d=4. Any errors in the header fragments are corrected. Of course, in other uses, any number of codeword interleaves may be used.

In operation 1204, in this example, 3-byte decoded or non-decoded header fragments are concatenated to obtain a single 12-byte header. There are $2^d$ possible ways to construct the header. Of course, in other uses, any size of header and/or byte fragments may be used.

In operation 1206, it is determined whether the header passes a CRC check. If so, the method continues to operation 1208; otherwise, the method 1200 continues to operation 1212.

If there are uncorrectable C1' codewords, they can be left uncorrected for the purpose of extracting the header. If header CRC checks, then C1' parity in that row may be modified as that header is assumed to be correct and thus its impact on C1' parity may be removed in operation 1210.

In operation 1208, it is determined whether content of the header is permitted, using any passes a CRC check. If so, the method continues to operation 1210; otherwise, the method 1200 continues to operation 1212.

In operation 1210, if the header with correct CRC was obtained in a particular SDS row, C1' parity may be modified by removing the impact of the header on C1' parity to obtain C1 parity.

In addition, header interpolation, as in legacy tape drives, may be used to obtain the header. Note that because of rewriting during read-while-write, the SDS rows may not be received in a fixed order, i.e., header interpolation may not be used during rewrite.

In operation 1212, it is determined whether the header can be obtained with interpolation. If so, the method continues to operation 1210; otherwise, the method 1200 continues to operation 1214.

In operation 1214, if a header with correct CRC was not obtained in a particular SDS row or header content is not permitted, C1' parity cannot be modified. In this case, the C1' parity is erased to indicate that C1 parity is unknown.

According to various embodiments, the method 1200 may be performed by a system via logic executing each operation, by a computer program product, or by some other device or system. The computer program product may include a computer readable storage medium having program code embodied therewith, and the program code may be readable/executable by a tape drive to cause the method 1200 to be performed.

Figure 13:
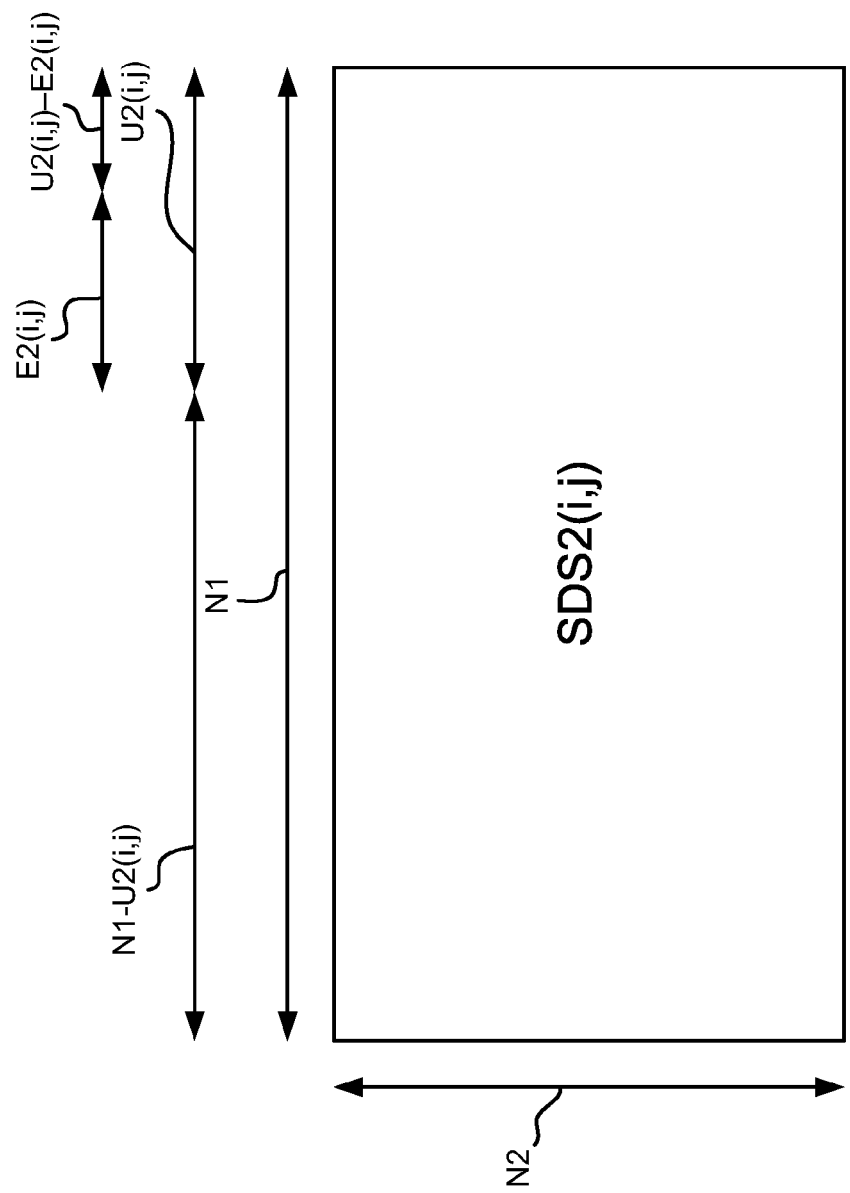
FIG. 13 is a representation of a sub data set—SDS2(i,j), according to one embodiment.

FIG. 13 shows a representation of SDS2(i,j) according to one embodiment. This representation shows the number of rows N2, the number of columns N1, an exemplary number of uncorrectable C2 codewords, U2(i,j), where i is an iteration counter and j is a current interleave in a row, an exemplary second parameter, E2(i,j), along with associated calculations. An SDS row contains j_max*N1 symbols. FIG. 13 depicts only an interleave j of the SDS2(i) where every row is a C1 codeword and every column is a C2 codeword, where SDS2(i) is obtained by interleaving j_max of the arrays in FIG. 13.

Figure 14:
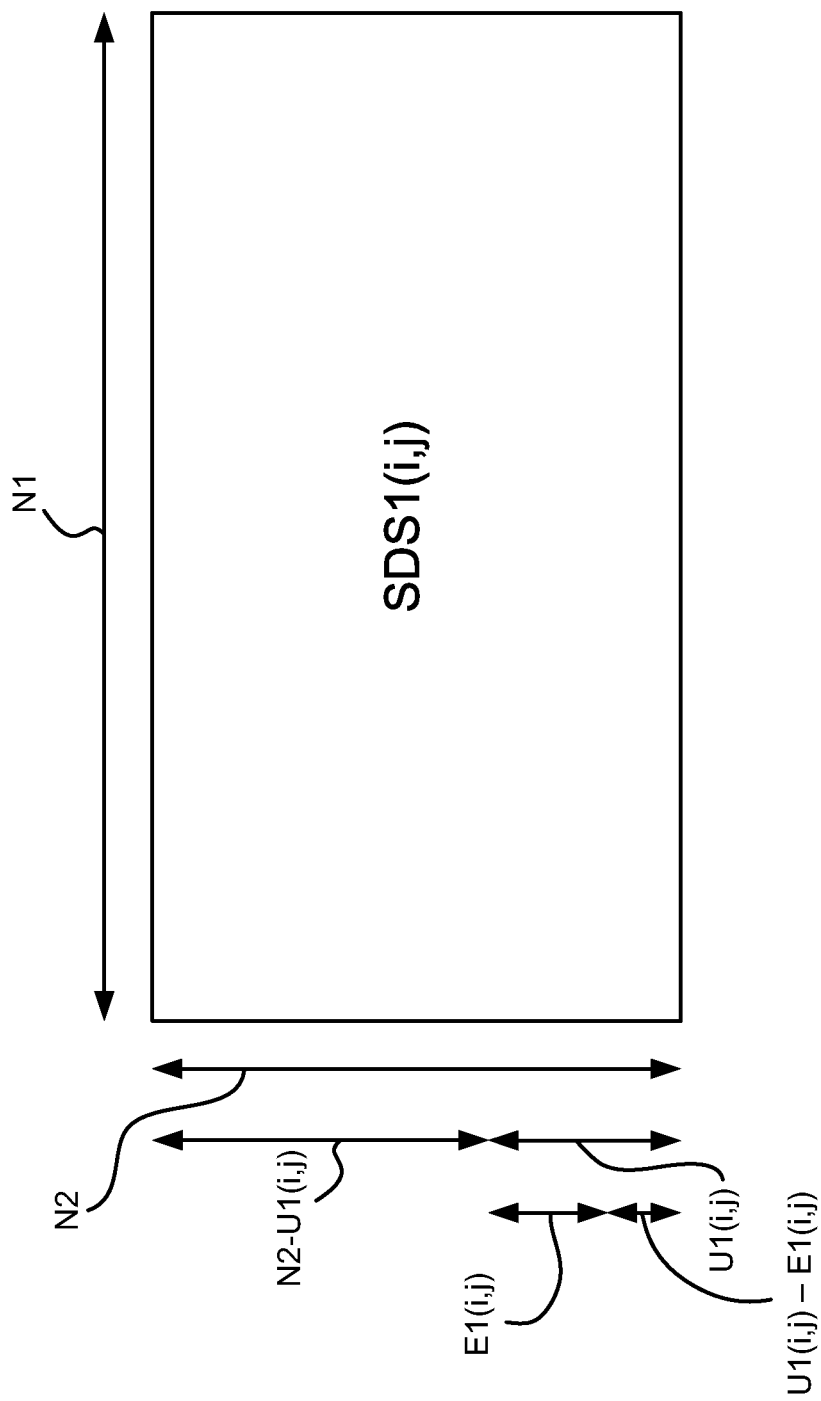
FIG. 14 is a representation of a sub data set—SDS1(i,j), according to one embodiment.

FIG. 14 shows a representation of SDS1(i,j) according to one embodiment. This representation shows the number of rows N2, the number of columns N1, an exemplary number of uncorrectable C1 codewords, U1(i,j), where i is an iteration counter and j is a current interleave in a row, an exemplary second parameter, E1(i,j), along with associated calculations. An SDS row contains j_max*N1 symbols. FIG. 14 depicts only an interleave j of the SDS1(i) where every row is a C1 codeword and every column is a C2 codeword, where SDS1(i) is obtained by interleaving j_max of the arrays in FIG. 14.

Figure 15:
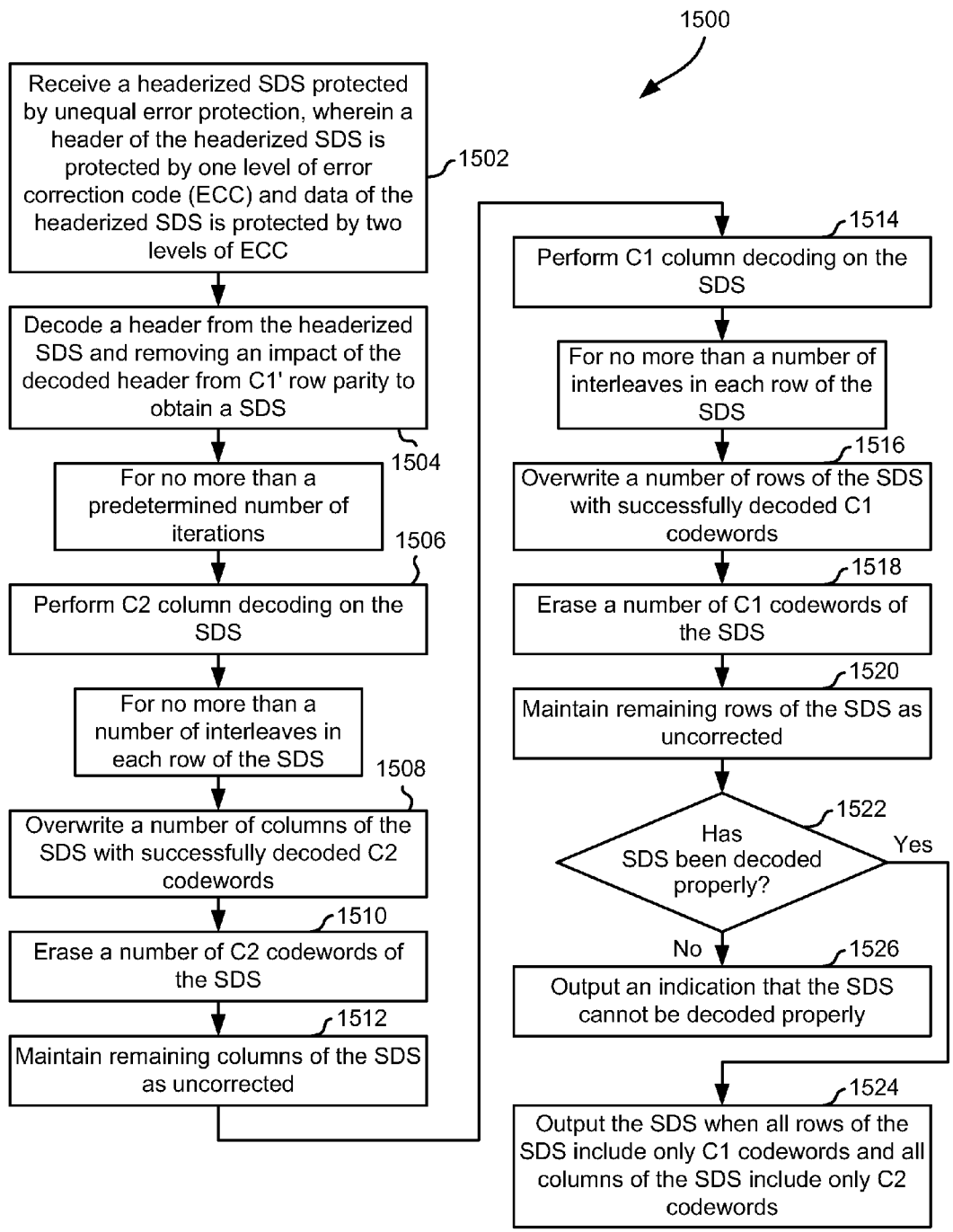
FIG. 15 is a flowchart of a method according to one embodiment.

Now referring to FIG. 15, a method 1500 for decoding a SDS is shown according to one embodiment. The method 1500 may be performed in accordance with the present invention in any of the environments depicted in FIGS. 1-10 and 12-14, among others, in various embodiments. Of course, more or less operations than those specifically described in FIG. 15 may be included in method 1500, as would be understood by one of skill in the art upon reading the present descriptions.

Each of the steps of the method 1500 may be performed by any suitable component of the operating environment. For example, in various non-limiting embodiments, the method 1500 may be partially or entirely performed by a C1/C2 encoding/decoding system, a tape drive, a hard disk drive, an optical drive, a processor (such as a CPU, an ASIC, a FPGA, etc.) which may be embedded in and/or operate within a system, etc.

As shown in FIG. 15, method 1500 may initiate with operation 1502, where a headerized SDS protected by unequal error protection is received. A header of the headerized SDS is protected by one level of ECC and data of the headerized SDS is protected by two levels of ECC.

In operation 1504, a header is decoded from the headerized SDS and an impact of the decoded header is removed from C1' row parity to obtain a SDS.

Operations 1506-1520 are repeated for no more than a predetermined number of iterations.

In operation 1506, C2 column decoding is performed on the SDS.

Operations 1508-1512 are repeated for no more than a total number of interleaves. In operation 1508, a number of columns of the SDS are overwritten with successfully decoded C2 codewords.

In operation 1510, a number of C2 codewords of the SDS are erased, with any overwritten C2 codewords (columns in preferred embodiments) not being erased in this iteration.

In operation 1512, remaining columns of the SDS are maintained as uncorrected.

In operation 1514, C1 row decoding is performed on the SDS.

Operations 1516-1520 are repeated for no more than a total number of interleaves. In operation 1516, a number of rows of the SDS are overwritten with successfully decoded C1 codewords.

In operation 1518, a number of C1 codewords of the SDS are erased, with any overwritten C1 codewords not being erased in this iteration.

In operation 1520, remaining rows of the SDS are maintained as uncorrected.

In operation 1522, it is determined whether the SDS has been properly decoded.

In operation 1524, when all rows of the SDS include only C1 codewords and all columns of the SDS include only C2 codewords, the SDS is output. Otherwise, in operation 1526, an indication that the SDS cannot be decoded properly is output.

In some further embodiments, the method 1500 may include performing an error check on the decoded header and erasing row parity associated with the header from the SDS to indicate that C1 row parity is unknown when the decoded header fails the error check.

According to some approaches, the header of the headerized SDS may be protected by C1 encoding and data of the headerized SDS may be protected by C1 encoding and C2 encoding.

In another embodiment, the method 1500 may include selecting a first parameter $E2(i,j)$, where i is an iteration counter and j is a current interleave in a row, such that $0 \leq E2(i,j) \leq U2(i,j)$ and $0 \leq E2(i,j) \leq (N1-K1)$, where $U2(i,j)$ is a number of uncorrectable C2 codewords in the current interleave j, N1 is a total number of symbols in a C1 codeword, and K1 is a number of data symbols in a C1 codeword. Furthermore, the number of columns of the SDS overwritten in a given iteration and a given interleave may be $N1-U2(i,j)$ columns, and the number of C2 codewords erased may be $E2(i,j)$ C2 codewords.

In another embodiment, the method 1500 may include selecting a second parameter $E1(i,j)$, where i is an iteration counter and j is a current interleave in a row, such that $0 \leq E1(i,j) \leq U1(i,j)$ and $0 \leq E1(i,j) \leq (N2-K2)$, where $U1(i,j)$ is a number of uncorrectable C1 codewords in the current interleave j, N2 is a total number of symbols in a C2 codeword, and K2 is a number of data symbols in a C2 codeword. Furthermore, the number of C1 codewords of the SDS overwritten in a given iteration and a given interleave may be N2−U1(i,j) C1 codewords, and the number of C1 codewords erased may be E1(i,j) C1 codewords.

According to various embodiments, the method 1500 may be performed by a system via logic executing each operation, by a computer program product, or by some other device or system. The computer program product may include a computer readable storage medium having program code embodied therewith, and the program code may be readable/executable by a tape drive to cause the method 1500 to be performed.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system for decoding a headerized sub data set (SDS), the system comprising:
   logic adapted to receive a headerized SDS protected by unequal error protection, wherein a header of the headerized SDS is protected by one level of error correction code (ECC) and data of the headerized SDS is protected by two levels of ECC;
   logic adapted to decode a header from the headerized SDS and removing an impact of the header from C1 row parity to obtain a SDS;
   logic adapted to, for no more than a predetermined number of iterations:
      perform C2 column decoding on the SDS; and
      for no more than a number of interleaves in each row of the SDS:
         overwrite a number of columns of the SDS with successfully decoded C2 codewords;
         erase a number of C2 codewords of the SDS; and
         maintain remaining columns of the SDS as uncorrected;
      perform C1 row decoding on the SDS;
      for no more than a number of interleaves in each row of the SDS:
         overwrite a number of rows of the SDS with successfully decoded C1 codewords;
         erase a number of C1 codewords of the SDS; and
         maintain remaining rows of the SDS as uncorrected; and
   logic adapted to output the SDS when all rows of the SDS include only C1 codewords and all columns of the SDS include only C2 codewords; otherwise, output an indication that the SDS cannot be decoded properly.

2. The system as recited in claim 1, further comprising:
   logic adapted to perform an error check on the header; and
   logic adapted to erase row parity associated with the header from the SDS to indicate that C1 row parity is unknown when the header fails the error check.

3. The system as recited in claim 1, wherein the header of the headerized SDS is protected by C1 encoding and data of the headerized SDS is protected by C1 encoding and C2 encoding.

4. The system as recited in claim 1, further comprising logic adapted to select a first parameter E2(i,j), where i is an iteration counter and j is a current interleave in a row, such that $0 \leq E2(i,j) \leq U2(i,j)$ and $0 \leq E2(i,j) \leq (N1-K1)$, where U2(i,j) is a number of uncorrectable C2 codewords in the current interleave j, N1 is a total number of symbols in a C1 codeword, and K1 is a number of data symbols in a C1 codeword.

5. The system as recited in claim 4, wherein the number of columns of the SDS overwritten in a given iteration and a given interleave is N1−U2(i,j) columns, and wherein the number of C2 codewords erased is E2(i,j) C2 codewords.

6. The system as recited in claim 1, further comprising logic adapted to select a second parameter E1(i,j), where i is an iteration counter and j is a current interleave in a row, such that $0 \leq E1(i,j) \leq U1(i,j)$ and $0 \leq E1(i,j) \leq (N2-K2)$, where U1(i,j) is a number of uncorrectable C1 codewords in the current interleave j, N2 is a total number of symbols in a column, and K2 is a number of data symbols in a column.

7. The system as recited in claim 6, wherein the number of C1 codewords of the SDS overwritten in a given iteration and a given interleave is N2−U1(i,j) C1 codewords, and wherein the number of C1 codewords erased is E1(i,j) C1 codewords.

8. A system for decoding a headerized sub data set (SDS), the system comprising:
   logic adapted to receive a headerized SDS protected by unequal error protection, wherein a header of the headerized SDS is protected by one level of error correction code (ECC) and data of the headerized SDS is protected by two levels of ECC;
   logic adapted to perform C1' row decoding to decode a header from the headerized SDS by modifying C1' row parity of the headerized SDS by removing an impact of the header from the C1' row parity to obtain C1 row parity;
   logic adapted to extract the header from the headerized SDS to obtain a SDS1(0) and performing an error check on the header;
   logic adapted to erase the C1' row parity to indicate that C1 row parity is unknown when the header fails the error check;
   for no more than a predetermined number of iterations, $i \leq i\_max$, where i is an iteration counter and i_max is a maximum number of iterations:
      logic adapted to perform C2 column decoding on the SDS1(i−1);
      logic adapted to determine a number of uncorrectable C2 codewords in a current interleave, j, of a row, where the number of uncorrectable C2 codewords is U2(i,j), with $0 \leq U2(i,j) \leq N1$, where N1 is a total number of symbols in a C1 codeword;

logic adapted to select a first parameter E2(i,j), such that $0 \leq E2(i,j) \leq U2(i,j)$ and $0 \leq E2(i,j) \leq (N1-K1)$, where K1 is a number of data symbols in a C1 codeword;

for $1 \leq j \leq j\_max$ iterations, where j_max is a maximum number of interleaves:

logic adapted to overwrite N1−U2(i,j) columns of SDS1(i−1,j) with successfully decoded C2 codewords, where SDS1(i−1,j) is a first calculated SDS for interleave j;

logic adapted to erase E2(i,j) C2 codewords out of a total of U2(i,j) C2 codewords in SDS1(i−1,j);

logic adapted to maintain U2(i,j)−E2(i,j) C2 codewords in SDS1(i−1,j) uncorrected;

logic adapted to combine each interleave of overwritten and erased SDS1(i−1,j) to form SDS2(i), where SDS2(i) is a first calculated SDS for iteration i; and logic adapted to stop iterative processing when all rows of SDS2(i) include only C1 codewords and all columns of SDS2(i) include only C2 codewords and output a decoded SDS, SDS2(i);

logic adapted to perform C1 row decoding on SDS2(i);

logic adapted to determine a number of uncorrectable C1 codewords in the current interleave, j, where the number of uncorrectable C1 codewords is U1(i,j), with $0 \leq U1(i,j) \leq N2$, where N2 is a total number of symbols in a column;

logic adapted to select a second parameter E1(i,j) such that $0 \leq E1(i,j) \leq U1(i,j)$ and $0 \leq E1(i,j) \leq (N2-K2)$, where K2 is a number of data symbols in a column;

for $1 \leq j \leq j\_max$ iterations, where j_max is a maximum number of interleaves:

logic adapted to overwrite N2−U1(i,j) columns of SDS2(i,j) with successfully decoded C1 codewords, where SDS2(i,j) is a second calculated SDS for interleave j;

logic adapted to erase E1(i,j) C1 codewords out of a total of U1(i,j) C1 codewords in SDS2(i,j);

logic adapted to maintain U1(i,j)−E1(i,j) C1 codewords in SDS2(i,j) uncorrected;

logic adapted to combine each interleave of overwritten and erased SDS2(i,j) to form SDS1(i), where SDS1(i) is a second calculated SDS for iteration i; and logic adapted to stop iteratively processing when all rows of SDS1(i) include only C1 codewords and all columns of SDS1(i) include only C2 codewords and outputting a decoded SDS, SDS1(i); and logic adapted to increment the iteration counter, i, by one; and logic adapted to output an indication that the headerized SDS cannot be decoded properly when the maximum number of iterations has been reached and all rows are not C1 codewords and/or all columns are not C2 codewords.

9. The system as recited in claim 8, wherein the header of the headerized SDS is protected by C1 encoding and data of the headerized SDS is protected by C1 encoding and C2 encoding.

10. A method for decoding a headerized sub data set (SDS), the method comprising:

receiving a headerized SDS protected by unequal error protection, wherein a header of the headerized SDS is protected by one level of error correction code (ECC) and data of the headerized SDS is protected by two levels of ECC;

decoding a header from the headerized SDS and removing an impact of the header from C1 row parity to obtain a SDS;

for no more than a predetermined number of iterations:

performing C2 column decoding on the SDS;

for no more than a number of interleaves in each row of the SDS:

overwriting a number of columns of the SDS with successfully decoded C2 codewords;

erasing a number of C2 codewords of the SDS; and maintaining remaining columns of the SDS as uncorrected;

performing C1 row decoding on the SDS;

for no more than a number of interleaves in each row of the SDS:

overwriting a number of rows of the SDS with successfully decoded C1 codewords;

erasing a number of C1 codewords of the SDS; and maintaining remaining rows of the SDS as uncorrected; and outputting the SDS when all rows of the SDS include only C1 codewords and all columns of the SDS include only C2 codewords; otherwise, outputting an indication that the SDS cannot be decoded properly.

11. The method as recited in claim 10, further comprising:

performing an error check on the header; and erasing row parity associated with the header from the SDS to indicate that C1 row parity is unknown when the header fails the error check.

12. The method as recited in claim 10, wherein the header of the headerized SDS is protected by C1 encoding and data of the headerized SDS is protected by C1 encoding and C2 encoding.

13. The method as recited in claim 10, further comprising selecting a first parameter E2(i,j), where i is an iteration counter and j is a current interleave in a row, such that $0 \leq E2(i,j) \leq U2(i,j)$ and $0 \leq E2(i,j) \leq (N1-K1)$, where U2(i,j) is a number of uncorrectable C2 codewords in the current interleave j, N1 is a total number of symbols in a C1 codeword, and K1 is a number of data symbols in a C1 codeword.

14. The method as recited in claim 13, wherein the number of columns of the SDS overwritten in a given iteration and a given interleave is N1−U2(i,j) columns, and wherein the number of C2 codewords erased is E2(i,j) C2 codewords.

15. The method as recited in claim 10, further comprising selecting a second parameter E1(i,j), where i is an iteration counter and j is a current interleave in a row, such that $0 \leq E1(i,j) \leq U1(i,j)$ and $0 \leq E1(i,j) \leq (N2-K2)$, where U1(i,j) is a number of uncorrectable C1 codewords in the current interleave j, N2 is a total number of symbols in a column, and K2 is a number of data symbols in a column.

16. The method as recited in claim 15, wherein the number of C1 codewords of the SDS overwritten in a given iteration and a given interleave is N2−U1(i,j) C1 codewords, and wherein the number of C1 codewords erased is E1(i,j) C1 codewords.

17. A method for encoding sub data sets, the method comprising:

receiving a headerized sub data set (SDS) protected by unequal error protection, wherein a header of the headerized SDS is protected by one level of error correction code (ECC) and data of the headerized SDS is protected by two levels of ECC;

performing C1' row decoding to decode a header from the headerized SDS by modifying C1' row parity of the headerized SDS by removing an impact of the header from the C1' row parity to obtain C1 row parity;

extracting the header from the headerized SDS to obtain a SDS1(0) and performing an error check on the header;

erasing the C1' row parity to indicate that C1 row parity is unknown when the header fails the error check;

for no more than a predetermined number of iterations, $i \leq i\_max$, where i is an iteration counter and i_max is a maximum number of iterations:

performing C2 column decoding on the SDS1(i−1);

determining a number of uncorrectable C2 codewords in a current interleave j, wherein the number of uncorrectable C2 codewords is $U2(i,j)$, with $0 \leq U2(i,j) \leq N1$, where N1 is a total number of symbols in a C1 codeword;

selecting a first parameter $E2(i,j)$, where i is an iteration counter and j is a current interleave in a row, such that $0 \leq E2(i,j) \leq U2(i,j)$ and $0 \leq E2(i,j) \leq (N1-K1)$, where K1 is a number of data symbols in a C1 codeword;

for $1 \leq j \leq j\_max$ iterations, where j_max is a maximum number of interleaves:

overwriting $N1-U2(i,j)$ columns of SDS1(i−1,j) with successfully decoded C2 codewords, where SDS1(i−1,j) is a first calculated SDS for interleave j;

erasing $E2(i,j)$ C2 codewords out of a total of $U2(i,j)$ C2 codewords in SDS1(i−1,j);

maintaining $U2(i,j)-E2(i,j)$ C2 codewords in SDS1(i−1,j) uncorrected;

combining each interleave of overwritten and erased SDS1(i−1,j) to form SDS1(i), where SDS2(i) is a first calculated SDS for iteration i; and stopping the method when all rows of SDS2(i) include only C1 codewords and all columns of SDS2(i) include only C2 codewords and outputting a decoded SDS, SDS2(i);

performing C1 row decoding on SDS2(i);

determining a number of uncorrectable C1 codewords in the current interleave j, wherein the number of uncorrectable C1 codewords is $U1(i,j)$, with $0 \leq U1(i,j) \leq N2$, where N2 is a total number of symbols in a column;

selecting a second parameter $E1(i,j)$ such that $0 \leq E1(i,j) \leq U1(i,j)$ and $0 \leq E1(i,j) \leq (N2-K2)$, where K2 is a number of data symbols in a column;

for $1 \leq j \leq j\_max$ iterations, where j_max is a maximum number of interleaves:

overwriting $N2-U1(i,j)$ columns of SDS2(i,j) with successfully decoded C1 codewords, where SDS2(i,j) is a second calculated SDS for interleave j;

erasing $E1(i,j)$ C1 codewords out of a total of $U1(i,j)$ C1 codewords in SDS2(i,j);

maintaining $U1(i,j)-E1(i,j)$ C1 codewords in SDS2(i,j) uncorrected;

combining each interleave of overwritten and erased SDS2(i,j) to form SDS1(i), where SDS1(i) is a second calculated SDS for iteration i; and stopping the method when all rows of SDS1(i) include only C1 codewords and all columns of SDS1(i) include only C2 codewords and outputting a decoded SDS, SDS1(i); and incrementing the iteration counter, i, by one; and outputting an indication that the headerized SDS cannot be decoded properly when the maximum number of iterations has been reached and all rows are not C1 codewords and/or all columns are not C2 codewords.

18. The method as recited in claim 17, wherein the header of the headerized SDS is protected by C1 encoding and data of the headerized SDS is protected by C1 encoding and C2 encoding.

19. A computer program product for decoding a headerized sub data set (SDS), the computer program product comprising a non-transitory computer readable storage medium having program code embodied therewith, the program code readable/executable by a tape drive to:

receive, by the tape drive, a headerized SDS protected by unequal error protection, wherein a header of the headerized SDS is protected by one level of error correction code (ECC) and data of the headerized SDS is protected by two levels of ECC;

decode, by the tape drive, a header from the headerized SDS and removing an impact of the header from C1 row parity to obtain a SDS;

for no more than a predetermined number of iterations:

perform, by the tape drive, C2 column decoding on the SDS; and for no more than a number of interleaves in each row of the SDS:

overwrite, by the tape drive, a number of columns of the SDS with successfully decoded C2 codewords;

erase, by the tape drive, a number of C2 codewords of the SDS; and maintain, by the tape drive, remaining columns of the SDS as uncorrected;

perform, by the tape drive, C1 row decoding on the SDS;

for no more than a number of interleaves in each row of the SDS:

overwrite, by the tape drive, a number of rows of the SDS with successfully decoded C1 codewords;

erase, by the tape drive, a number of C1 codewords of the SDS; and maintain, by the tape drive, remaining rows of the SDS as uncorrected; and output, by the tape drive, the SDS when all rows of the SDS include only C1 codewords and all columns of the SDS include only C2 codewords; otherwise, output an indication that the SDS cannot be decoded properly.

20. The computer program product as recited in claim 19, wherein the program code further causes the tape drive to:

perform an error check on the header; and erase row parity associated with the header from the SDS to indicate that C1 row parity is unknown when the header fails the error check.

21. The computer program product as recited in claim 19, wherein the header of the headerized SDS is protected by C1 encoding and data of the headerized SDS is protected by C1 encoding and C2 encoding.

22. The computer program product as recited in claim 19, wherein the program code further causes the tape drive to select a first parameter $E2(i,j)$, where i is an iteration counter and j is a current interleave in a row, such that $0 \leq E2(i,j) \leq U2(i,j)$ and $0 \leq E2(i,j) \leq (N1-K1)$, where $U2(i,j)$ is a number of uncorrectable C2 codewords in the current interleave j, N1 is a total number of symbols in a C1 codeword, and K1 is a number of data symbols in a C1 codeword.

23. The computer program product as recited in claim 22, wherein the number of columns of the SDS overwritten in a given iteration and a given interleave is $N1-U2(i,j)$ columns, and wherein the number of C2 codewords erased is $E2(i,j)$ C2 codewords.

24. The computer program product as recited in claim 19, wherein the program code further causes the tape drive to select a second parameter $E1(i,j)$, where i is an iteration counter and j is a current interleave in a row, such that $0 \leq E1(i,j) \leq U1(i,j)$ and $0 \leq E1(i,j) \leq (N2-K2)$, where $U1(i,j)$ is a number of uncorrectable C1 codewords in the current interleave j, N2 is a total number of symbols in a column, and K2 is a number of data symbols in a column.

25. The computer program product as recited in claim 24, wherein the number of C1 codewords of the SDS overwritten in a given iteration and a given interleave is N2−U1(i,j) C1 codewords, and wherein the number of C1 codewords erased is E1(i,j) C1 codewords.

\* \* \* \* \*